United States Patent
Jeong

(10) Patent No.: US 11,605,676 B2
(45) Date of Patent: Mar. 14, 2023

(54) DISPLAY DEVICE AND METHOD FOR MANUFACTURING THE SAME

(71) Applicant: LG Display Co., Ltd., Seoul (KR)

(72) Inventor: Song-Yi Jeong, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 88 days.

(21) Appl. No.: 17/346,702

(22) Filed: Jun. 14, 2021

(65) Prior Publication Data

US 2021/0313403 A1    Oct. 7, 2021

Related U.S. Application Data

(62) Division of application No. 16/727,258, filed on Dec. 26, 2019, now Pat. No. 11,088,214.

(30) Foreign Application Priority Data

Dec. 31, 2018    (KR) .................... 10-2018-0173660

(51) Int. Cl.
     *H01L 27/32*        (2006.01)
     *H01L 51/50*        (2006.01)

(52) U.S. Cl.
     CPC ...... *H01L 27/3218* (2013.01); *H01L 27/3246* (2013.01); *H01L 51/5068* (2013.01); *H01L 51/5084* (2013.01)

(58) Field of Classification Search
     CPC ............ H01L 27/3209; H01L 27/3218; H01L 51/504
     See application file for complete search history.

(56) References Cited

U.S. PATENT DOCUMENTS

| | | | |
|---|---|---|---|
| 2007/0046195 A1* | 3/2007 | Chin | H01L 27/3211 313/506 |
| 2012/0212515 A1* | 8/2012 | Hamer | G09G 3/3225 345/77 |
| 2013/0270531 A1* | 10/2013 | Seo | H01L 51/5206 257/40 |
| 2013/0285537 A1* | 10/2013 | Chaji | H01L 27/3218 445/24 |

* cited by examiner

*Primary Examiner* — Tuan A Hoang
(74) *Attorney, Agent, or Firm* — Polsinelli PC

(57) ABSTRACT

A display device achieves a high resolution and a low power consumption through provision of subpixels each including a single light emitting layer and subpixels each including a plurality of overlapping light emitting layers. In the display device, it is also unnecessary to increase the number of expensive fine metal masks even for rendering of various grayscales. In addition, in the display device, different light emitting layers overlap with each other, and a charge generation layer is disposed between the overlapping light emitting layers, and, as such, emission of a secondary color can be achieved without necessity of a material for an additional light emitting layer of the secondary color.

20 Claims, 23 Drawing Sheets

GMO

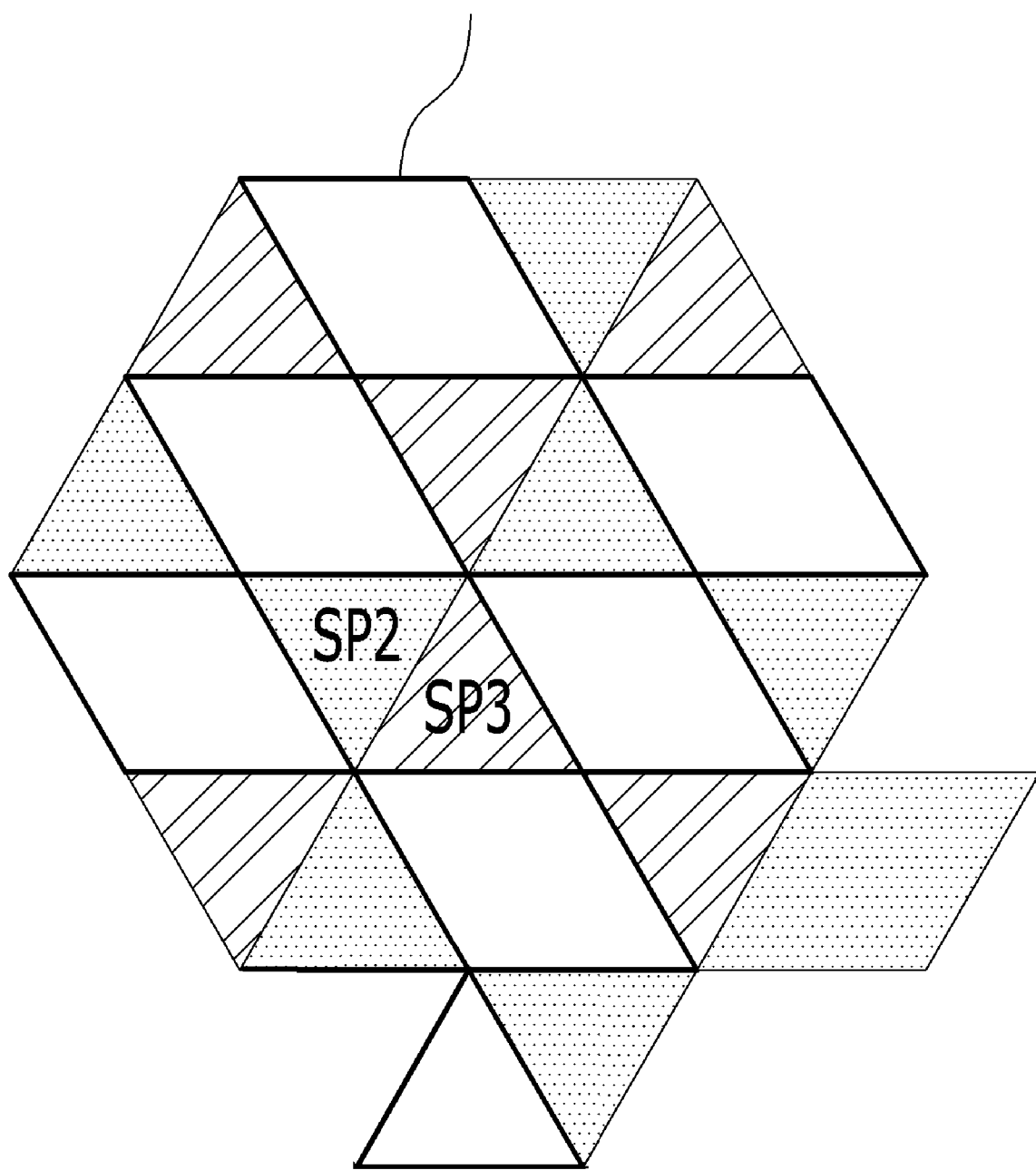

DISPLAY DEVICE AND METHOD FOR MANUFACTURING THE SAME

CROSS REFERENCE TO RELATED APPLICATION

This application is a divisional of U.S. patent application Ser. No. 16/727,258, filed Dec. 26, 2019, which claims the benefit of Korean Patent Application No. 10-2018-0173660, filed on Dec. 31, 2018, which are hereby incorporated by reference in their entirety for all purposes as if fully set forth herein.

BACKGROUND OF THE DISCLOSURE

Field of the Disclosure

The present disclosure relates to a display device, and more particularly to a display device capable of achieving a high resolution and reduction in power consumption through particular arrangement of subpixels and selective overlap of light emitting layers and charge generation layers at the subpixels, and a method for manufacturing the display device.

Description of the Background

In recent years, with the advent of the information age, the field of displays to visually express electrical information signals has rapidly developed. As such, a variety of flat display devices having superior performance such as slimness, lightness and low power consumption have rapidly been developed as replacements for existing cathode ray tubes (CRTs).

Representative examples of such flat display devices may include liquid crystal display (LCD) devices, plasma display panel (PDP) devices, field emission display (FED) devices, organic light emitting display (OLED) devices, quantum dot display devices, and the like.

Among these displays, self-luminous display devices such as OLED devices are considered an application having competitiveness in that they do not require a separate light source while achieving compactness and distinct color display.

Meanwhile, such an OLED device includes sub-pixels each including a self-luminous organic light emitting element. The organic light emitting element includes two electrodes facing each other, and a light emitting layer disposed between the two electrodes. The light emitting layer emits light when electrons and holes transported to the light emitting layer are recombined.

In a general OLED device, a red light emitting layer, a green light emitting layer and a blue light emitting layer as light emitting layers for color rendering are provided at different pixels, respectively. In this connection, formation of each color light emitting layer at each subpixel may be achieved by preparing a fine metal mask provided with an opening corresponding to an area where the light emitting layer is to be formed, and depositing a material for the light emitting layer on a substrate through the opening. The fine metal mask may be loosened due to gravity and, as such, there may be misalignment between the opening of the fine metal mask and the deposition material formation area. Furthermore, gaps are present between a deposition source and the fine metal mask and between the fine metal mask and the substrate and, as such, it may be difficult to form a light emitting layer completely having the same shape as the opening of the fine metal mask. To this end, the opening of the fine metal mask should be formed to have a predetermined size or greater, taking into consideration process margins. In addition, it may be difficult to realize sufficiently high resolution only through an arrangement in which color light emitting layers are simply disposed at respective subpixels.

Furthermore, for emission of a secondary color between colors of different light emitting layers, subpixels provided with the light emitting layers while being disposed adjacent to each other should be simultaneously turned on. For this reason, there may be a problem of an increase in power consumption.

Meanwhile, when the above-mentioned general OLED device including color light emitting layers disposed at respective subpixels additionally includes, in addition to red, green and blue light emitting layers, a light emitting layer to emit a color different from those of the red, green and blue light emitting layers, it is necessary to develop a dopant and a host for the additional light emitting layer in order to obtain optimal efficiency.

SUMMARY OF THE DISCLOSURE

Accordingly, the present disclosure is directed to a display device and a method for manufacturing the same that substantially obviate one or more problems due to limitations and disadvantages of the related art.

More specifically, the present disclosure provides a display device capable of achieving a high resolution and reduction in power consumption through particular arrangement of subpixels and selective overlap of light emitting layers and charge generation layers at the subpixels, and a method for manufacturing the display device.

The display device of the present disclosure may achieve effects of high resolution and low power consumption through provision of subpixels each including a single light emitting layer and subpixels each including a plurality of overlapping light emitting layers. In the display device of the present disclosure, it may also be unnecessary to increase the number of expensive fine metal masks even for rendering of various grayscales. In addition, in the display device of the present disclosure, different light emitting layers overlap with each other, and a charge generation layer is disposed between the overlapping light emitting layers, and, as such, emission of a secondary color may be achieved without necessity of a material for an additional light emitting layer of the secondary color.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, a display device includes a reference subpixel provided with a single light emitting layer on a substrate, a mixed subpixel provided with two or more light emitting layers overlapping each other on the substrate, to emit different colors, a charge generation layer at the mixed subpixel between the light emitting layers of the mixed subpixel to emit different colors, first electrodes respectively beneath the light emitting layer of the reference subpixel and a lower one of the light emitting layers of the mixed subpixel, and a second electrode over the light emitting layer of the reference subpixel and an upper one of the light emitting layers of the mixed subpixel. The second electrode may be integrated over the entirety of the reference subpixel and the mixed subpixel.

The reference subpixel may be one of first to third subpixels each provided with an associated one of first to third light emitting layers as a single light emitting layer. The two light emitting layers of the mixed subpixel to emit different colors may be extensions of at least two of the first to third light emitting layers of the first to third subpixels, respectively.

The display device may further include a bank provided at a boundary between the reference subpixels.

Each of the first to third light emitting layers at the reference subpixel may be extended to at least one mixed subpixel adjacent to the reference subpixel, and continuous over the at least one reference subpixel, the at least one mixed subpixel, and the bank therebetween.

The first light emitting layer may have a peak wavelength in a wavelength range of 430 to 480 nm. The second light emitting layer may have a peak wavelength in a wavelength range of 600 to 650 nm. The third light emitting layer may have a peak wavelength in a wavelength range of 500 to 580 nm.

The display device may further include a common hole transport layer disposed at the reference subpixel between the first electrode of the reference subpixel and one of the first to third light emitting layer as the single light emitting layer of the reference subpixel, and a common electron transport layer disposed at the reference subpixel between one of the first to third light emitting layer as the single light emitting layer of the reference subpixel and the second electrode. The common hole transport layer may extend continuously through the mixed subpixel between the first electrode of the mixed subpixel and a lowermost one of the light emitting layers of the mixed subpixel. The common electron transport layer may extend continuously through the mixed subpixel between an uppermost one of the light emitting layers of the mixed subpixel and the second electrode.

The mixed subpixel may have a laminated structure in which the extension of the first light emitting layer, a first charge generation layer, the extension of the second light emitting layer, a second charge generation layer and the extension of the third light emitting layer are sequentially laminated in this order between the first and second electrodes of the mixed subpixels, starting from a side near the first electrode.

Each of the first to third subpixels may be disposed adjacent to the mixed subpixel.

The mixed subpixel may include a fourth subpixel including a first extension of the first light emitting layer, a first extension of the second light emitting layer, and a first charge generation layer disposed between the first extension of the first light emitting layer and the first extension of the second light emitting layer, a fifth subpixel including a second extension of the second light emitting layer, a first extension of the third light emitting layer, and a second charge generation layer disposed between the second extension of the second light emitting layer and the first extension of the third light emitting layer, and a sixth subpixel including a second extension of the first light emitting layer and a second extension of the third light emitting layer, and a charge generation layer disposed at the same layer as the first charge generation layer or the second charge generation layer between the second extension of the first light emitting layer and the second extension of the third light emitting layer.

The first extension of the second light emitting layer may be disposed above the first extension of the first light emitting layer at the fourth subpixel. The first extension of the third light emitting layer may be disposed above the second extension of the second light emitting layer at the fifth subpixel. The second extension of the third light emitting layer may be disposed above the second extension of the first light emitting layer at the sixth subpixel.

The first to sixth subpixels may be arranged in a row direction or in a column direction in an order of the first subpixel, the fourth subpixel, the second subpixel, the fifth subpixel, the third subpixel and the sixth subpixel.

The first to sixth subpixels may be arranged within 6 divisional portions of a hexagonal area, respectively, in an order of the first subpixel, the fourth subpixel, the second subpixel, the fifth subpixel, the third subpixel and the sixth subpixel.

The mixed subpixel may include a fourth subpixel including a first extension of the first light emitting layer, a first extension of the second light emitting layer, and a first charge generation layer disposed between the first extension of the first light emitting layer and the first extension of the second light emitting layer, a fifth subpixel including a second extension of the second light emitting layer, a first extension of the third light emitting layer, and a second charge generation layer disposed between the second extension of the second light emitting layer and the first extension of the third light emitting layer, a sixth subpixel including a second extension of the first light emitting layer and a second extension of the third light emitting layer, and the first or second charge generation layer disposed between the second extension of the first light emitting layer and the second extension of the third light emitting layer, and a seventh subpixel including a third extension of the first light emitting layer, the first charge generation layer, a third extension of the second light emitting layer, the second charge generation layer and a third extension of the third light emitting layer laminated in this order.

The first to sixth subpixels may be disposed around the seventh subpixel in an order of the first subpixel, the fourth subpixel, the second subpixel, the fifth subpixel, the third subpixel and the sixth subpixel.

In another aspect of the present disclosure, a method for manufacturing a display device includes forming first electrodes at a plurality of subpixels on a substrate, respectively, forming first to third light emitting layers in predetermined areas at a part of the subpixels as single-type light emitting layers, respectively, thereby providing reference subpixels, and forming at least two of the first to third light emitting layers at the remaining part of the subpixels such that the light emitting layers overlap with each other, thereby forming mixed subpixels, and forming a second electrode on the first to third light emitting layers over the reference subpixels and the mixed subpixels.

The method may further include forming a charge generation layer between the at least two light emitting layers of each of the mixed subpixels.

Each of the first to third light emitting layers may be formed in at least two of the subpixels upon at least one of the reference subpixels and at least one of the mixed subpixels.

The method may further include forming a bank at boundaries of the reference subpixels and the mixed subpixels after the formation of the first electrodes.

Each of the first to third light emitting layers may extend over an associated one of the reference subpixels and the bank disposed adjacent to two or more of the mixed subpixels adjacent to the associated reference subpixel.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of the disclosure, illustrate aspect(s) of the disclosure and along with the description serve to explain the principle of the disclosure.

In the drawings:

FIGS. 11A to 11C are plan views illustrating masks for formation of first to third light emitting layers of FIG. 10, respectively;

DETAILED DESCRIPTION

Figure 1:
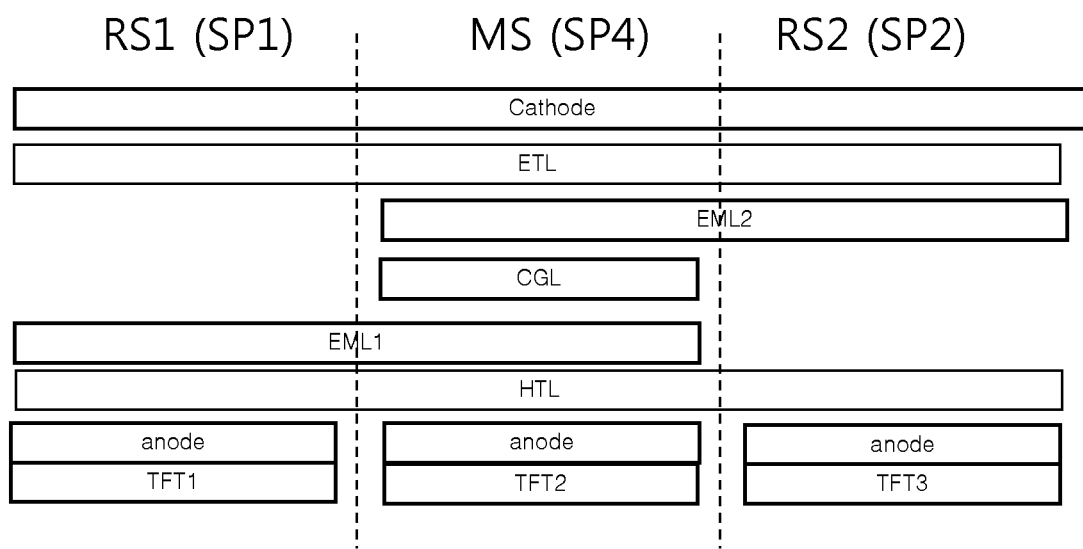
FIG. 1 is a cross-sectional view schematically illustrating a display device of the present disclosure.

Hereinafter, aspects of the present disclosure will be described in detail with reference to the accompanying drawings. Throughout the disclosure, the same reference numerals designate substantially the same constituent elements. In describing the present disclosure, moreover, a detailed description will be omitted when a specific description of publicly known technologies to which the disclosure pertains is judged to obscure the gist of the present disclosure. In addition, names of constituent elements used in the following description are selected for easy understanding of the present disclosure, and may differ from names of practical products.

The shape, size, ratio, angle, number and the like shown in the drawings to illustrate the aspects of the present disclosure are only for illustration and are not limited to the contents shown in the drawings. Wherever possible, the same reference numbers will be used throughout the drawings to refer to the same or like parts. In the following description, detailed descriptions of technologies or configurations related to the present disclosure may be omitted so as not to unnecessarily obscure the subject matter of the present disclosure. When terms such as "including", "having" and "comprising" are used throughout the specification, an additional component may be present, unless "only" is used. A component described in a singular form encompasses components in a plural form unless particularly stated otherwise.

It should be interpreted that the components included in the aspect of the present disclosure include an error range, although there is no additional particular description thereof.

In describing a variety of aspects of the present disclosure, when terms for location relation such as "on", "above", "under" and "next to" are used, at least one intervening element may be present between two elements unless "right" or "direct" is used.

In describing a variety of aspects of the present disclosure, when terms for temporal relation, such as "after", "subsequently", "next" and "before", are used, a non-continuous case may be present, unless "right" or "direct" is used.

In describing a variety of aspects of the present disclosure, terms such as "first" and "second" may be used to describe a variety of components, but these terms only aim to distinguish the same or similar components from one another. Accordingly, throughout the specification, a "first" component may be the same as a "second" component within the technical concept of the present disclosure, unless specifically mentioned otherwise.

The respective features of various aspects according to the present disclosure can be partially or entirely joined or combined and technically variably related or operated, and the aspects can be implemented independently or in combination.

FIG. 1 is a cross-sectional view schematically illustrating a display device of the present disclosure.

As illustrated in FIG. 1, the display device of the present disclosure includes reference subpixels RS (SP1 and SP2) respectively including a single light emitting layer EML1 and a single light emitting layer EML2, which are formed on a substrate 100 and a mixed subpixel MS (SP4) including two or more light emitting layers, for example, light emitting layers EML1 and EML2, formed on the substrate 100, to emit different colors, while overlapping each other. And a charge generation layer CGL is disposed between the light emitting layers EML1 and EML2 to emit different colors in the mixed subpixel MS (SP4). Each of the reference subpixels RS (SP1 or SP2) further includes a first electrode (anode) disposed beneath the single light emitting layer, for example, EML1 or EML2 and a second electrode (cathode) over the single light emitting layer EML1 or EML2. Each of the mixed subpixels MS (SP4) further includes a first electrode (anode) disposed beneath a lower one of the light emitting layers EML1 and EML2 and the second electrode (cathode) disposed over an upper one of the light emitting layers EML1 and EML2.

The single light emitting layers EML1 and EML2 of the reference subpixels RS (SP1 and SP2) may be extended to the mixed subpixel MS (SP4) adjacent to the reference subpixels RS. The light emitting layer EML1 is integrated at the reference subpixel RS1 and the mixed subpixel MS. And the light emitting layer EML2 is integrated at the reference subpixel RS2 and the mixed subpixel MS.

First, the reference subpixels RS and the mixed subpixel MS in the display device of the present disclosure will be described. Each reference subpixel RS means the subpixel SP1 or SP2 including the single light emitting layer EML1 or EML2. The mixed subpixel MS means the subpixel SP4 including two or more overlapping light emitting layers. The mixed subpixel MS may have an overlap structure varying in accordance with aspects. Layouts of the reference subpixel RS and the mixed subpixel MS may vary in accordance with aspects.

The display device of the present disclosure has the most important feature in that the single light emitting layers EML1 and EML2 are formed to extend from respective sub pixels RS such that the single light emitting layers EML1 and EML2 overlap with each other in the mixed subpixel MS. In accordance with this feature, the light emitting layers EML1 and EML2 may be formed over a plurality of pixels and, as such, it may be unnecessary to develop separate emission materials for emission of secondary colors, and to determine widths of light emitting portions of subpixels on a per light emitting layer basis. That is, when each light emitting layer is formed to cover two or more continuous subpixels, driving of the display device may be achieved on a per subpixel basis through provision of driving thin film transistors and first electrodes connected to respective driving thin film transistors for respective subpixels. As a result, it may be possible to realize resolution corresponding to 2 times or more the resolution that can be obtained at a given opening size of a fine metal mask (FMM).

The mixed subpixel MS, which includes a plurality of light emitting layers, to emit a secondary color thereof, also includes the charge generation layer CGL disposed between the light emitting layers, for appropriate light emission of the light emitting layers. That is, the charge generation layer CGL supplies holes and electrons to the light emitting layers EML1 and EML2, thereby enabling the light emitting layers EML1 and EML2 to achieve optimal light emission through recombination of holes and electrons therein. Finally, emission of a secondary color may be achieved in accordance with mixture of colors emitted from the light emitting layers EML1 and EML2.

Each of the reference subpixels RS and the mixed subpixel MS may include a plurality of subpixels to emit different colors. The first electrodes (anodes) are separated from one another such that the first electrodes (anodes) may be driven for respective subpixels. The first electrodes (anodes) are connected to driving thin film transistors TFT1, TFT2 and TFT3, respectively. The driving thin film transistors TFT1, TFT2 and TFT3 are provided at the subpixels SP1, SP4 and SP2, respectively. Contrary to the first electrodes (anodes), the second electrode (cathode) is integrally formed over the reference subpixels RS (RS1 and RS2) and the mixed subpixel MS without being separated from one another. The second electrode (cathode) is grounded. Or a common voltage is applied to the second electrode.

The configuration including one first electrode (anode), one second electrode (cathode) and one light emitting layer EML1 or EML2 while selectively including both the light emitting layers EML1 and EML2 and one charge generation layer CGL disposed between the light emitting layers EML1 and EML2 is referred to as a light emitting diode. When the materials of the light emitting layer EML1 and/or the light emitting layer EML2 are organic substances, the light emitting diodes associated therewith are referred to as "organic light emitting diodes". When the materials are inorganic substances, the light emitting diodes associated therewith are referred to as "inorganic light emitting diodes". Display devices including organic light emitting diodes are referred to as "organic light emitting devices", whereas display devices including inorganic light emitting diodes are referred to as "inorganic light emitting devices".

The display device of the present disclosure is not limited by organic light emitting layers and, as such, may be applied to both an organic light emitting display device and an inorganic light emitting display device. If necessary, the display device of the present disclosure may also be applied to the case in which both an organic substance and an inorganic substance are used for a light emitting layer or a structure in which a light emitting layer made of an organic substance and a light emitting layer made of an inorganic substance are laminated.

The first electrodes (anodes) and the second electrode (cathode) may be disposed in the order as illustrated in FIG. 1. Alternatively, the first electrodes (anodes) and the second electrode (cathode) may be disposed in a vertically-reversed order such that the second electrode (cathode) is disposed at a lower side, and the first electrodes (anodes) are disposed at an upper side.

Each first electrode (anode) may include a reflective electrode, and each second electrode (cathode) may include a transparent electrode or a translucent metal electrode. The first electrodes (anodes) are electrically connected to drain electrodes of the driving thin film transistors TFT1, TFT2 and TFT3 via contact holes, respectively. When the display device is of a top emission type, each first electrode (anode) may be made of an opaque conductive material having high reflectance. For example, the first electrode (anode) may be made of silver (Ag), aluminum (Al), gold (Au), molybdenum (Mo), tungsten (W), chromium (Cr) or an alloy thereof.

Each second electrode (cathode), which is disposed over an organic substance stack including one or more light emitting layers, may be made of a transparent conductive material such as indium tin oxide (ITO) or indium zinc oxide (IZO) or a transreflective metal alloy such as an MgAg alloy when the display device is of a top emission type. In this case, accordingly, the second electrode may allow light emitted from the organic substance stack to pass therethrough in an upward direction.

When the display device is of a bottom emission type, the reflective electrode may be disposed at an upper side, and the transparent or translucent electrode may be disposed at a lower side.

Meanwhile, a common hole transport layer HTL, which is disposed between the first electrodes (anodes) and the light emitting layers EML1 and EML2, and a common electron transport layer ETL, which is disposed between the light emitting layers EML1 and EML2 and the second electrode (cathode), are further included in common in the reference subpixels RS1 and RS2 and the mixed subpixel MS, as a configuration not described in conjunction with FIG. 1. The common hole transport layer HTL includes a material such as N,N-di(naphthalen-1-yl)-N,N'-diphenylbenzidine (NPD), and takes part in hole injection and hole transport from the first electrodes (anodes) to the light emitting layers EML1 and EML2. The common hole transport layer HTL is disposed between the first electrodes (anode) and the first light emitting layer EML1 disposed at the lowermost side among the light emitting layers. The common electron transport layer ETL includes an anthracene-based material, and takes part in electron injection and electron transport from the second electrode (cathode) to the light emitting layers EML1 and EML2. The common electron transport layer ETL is disposed between the second electrode (cathode) and the second light emitting layer EML2 disposed at the uppermost side among the light emitting layers. Similarly to the second electrode (cathode), the common hole transport layer HTL and the common electrode transport layer ETL are formed in common at the reference subpixels RS (RS1 and RS2) and the mixed subpixel MS.

A method for manufacturing the display device of the present disclosure will be briefly described with reference to FIG. 1.

As illustrated in FIG. 1, the method for manufacturing the display device of the present disclosure includes steps of forming first electrodes at a plurality of subpixels on a substrate, respectively, forming first and second light emitting layers EML1 and EML2 on the first electrodes (anodes) in such a manner that the first and second light emitting layers EML1 and EML2 are disposed at predetermined regions of a part of the subpixels as single light emitting layers, respectively, to constitute reference subpixels RS (RS1 and RS2), while being disposed at the remaining part of the subpixels such that the first and second light emitting layers EML1 and EML2 overlap each other, to constitute mixed subpixels MS. The method further includes forming a second electrode (cathode) on all of the first and second light emitting layers EML1 and EML2 (cf. R, G and B in FIGS. 2 to 4B), to extend over the reference subpixels RS (RS1 and RS2) and the mixed subpixels (MS), thereby forming light emitting elements at respective subpixels.

Although FIG. 1 illustrates a most representative example in which two light emitting layers are used to embody a mixed subpixel therebetween, it may be possible to embody a mixed subpixel having a type different from that of the above-described example, using three or more light emitting layers. Concrete examples will be described later.

Hereinafter, display devices according to various aspects will be described.

Figure 2:
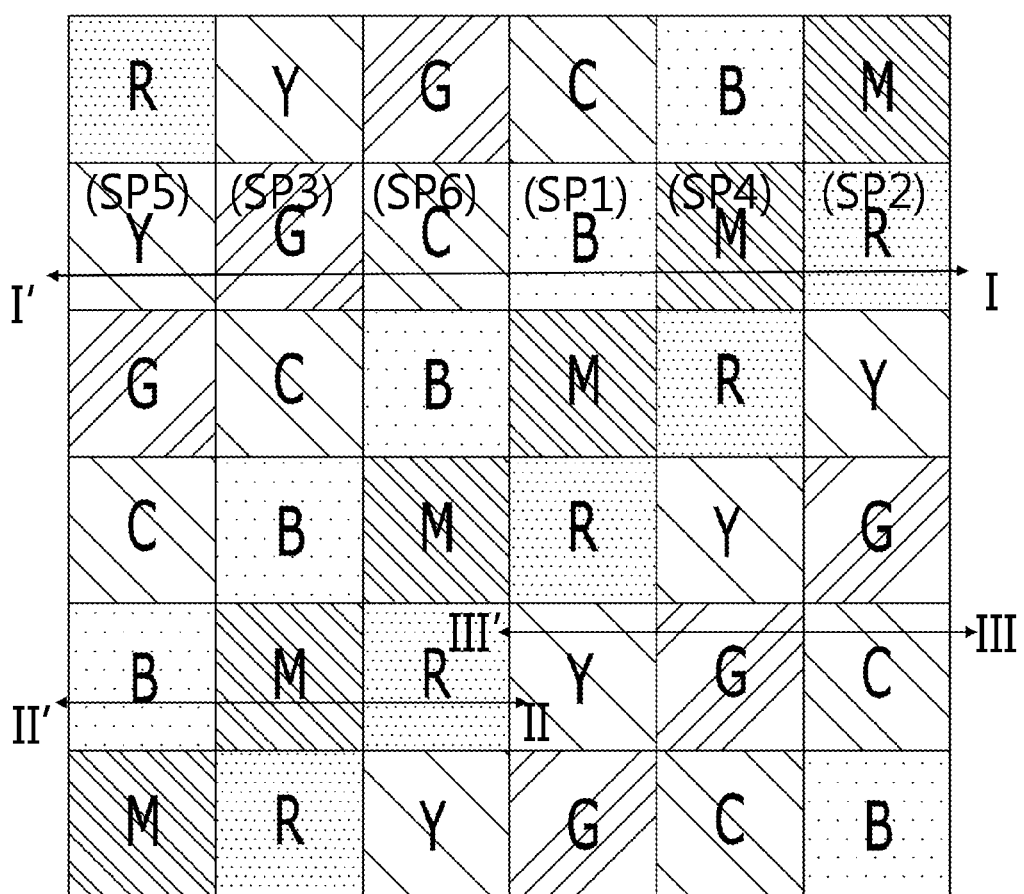
FIG. 2 is a plan view illustrating subpixel arrangement of a display device according to a first aspect of the present disclosure.
Figure 3:
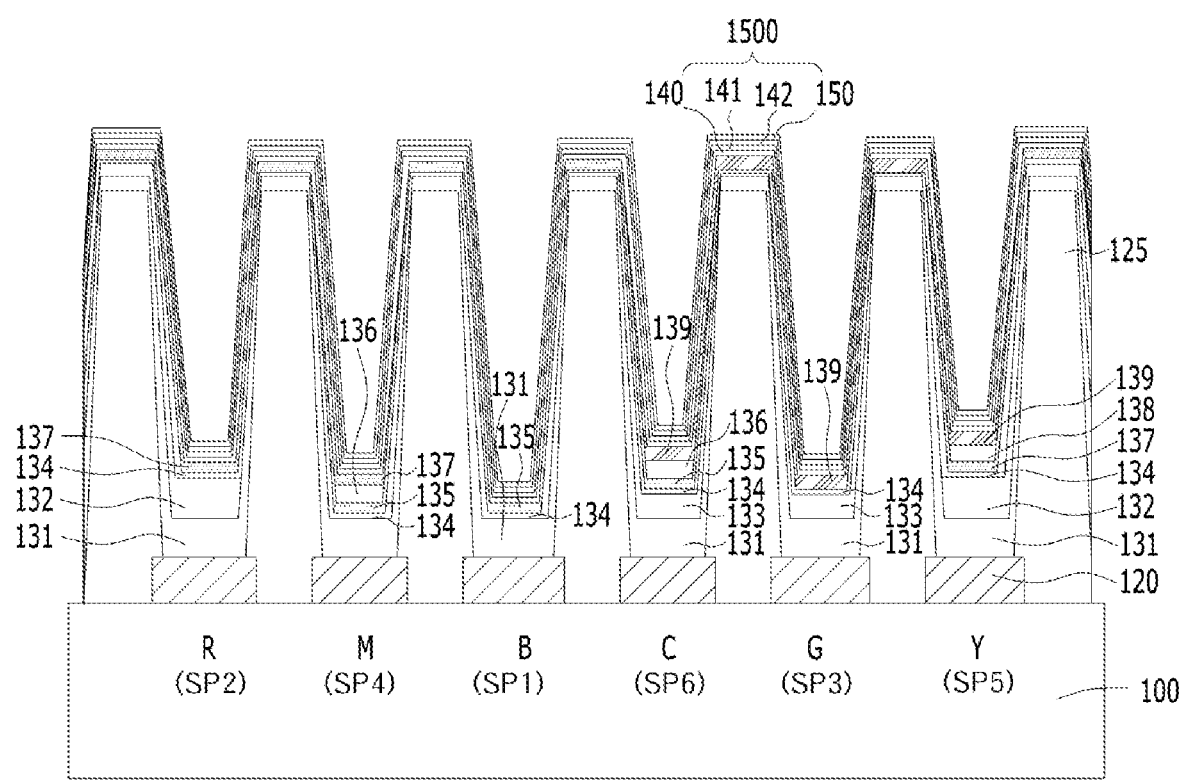
FIG. 3 is a cross-sectional view taken along line I-I' of FIG. 2.
Figure 4A:
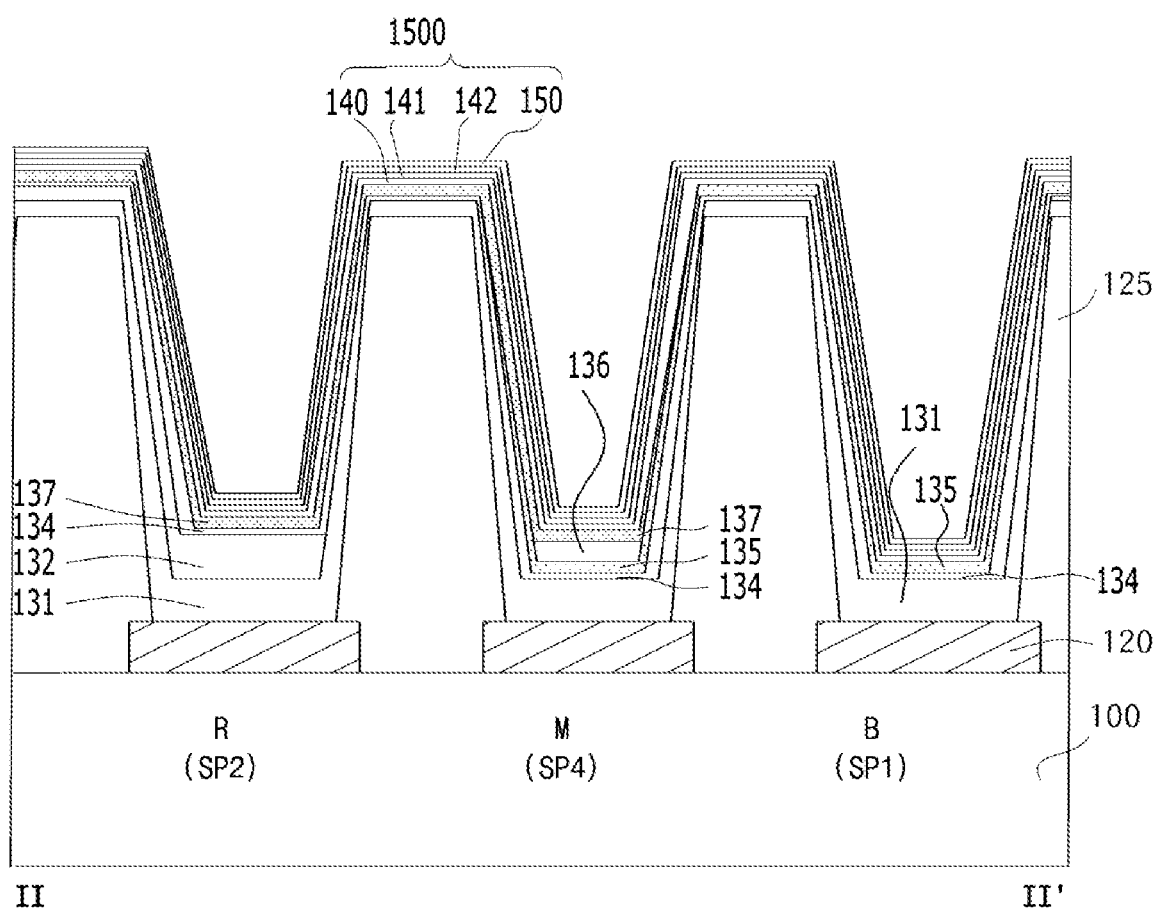
FIGS. 4A and 4B are cross-sectional views taken along lines II-II' and III-III' of FIG. 2, respectively.
Figure 4B:
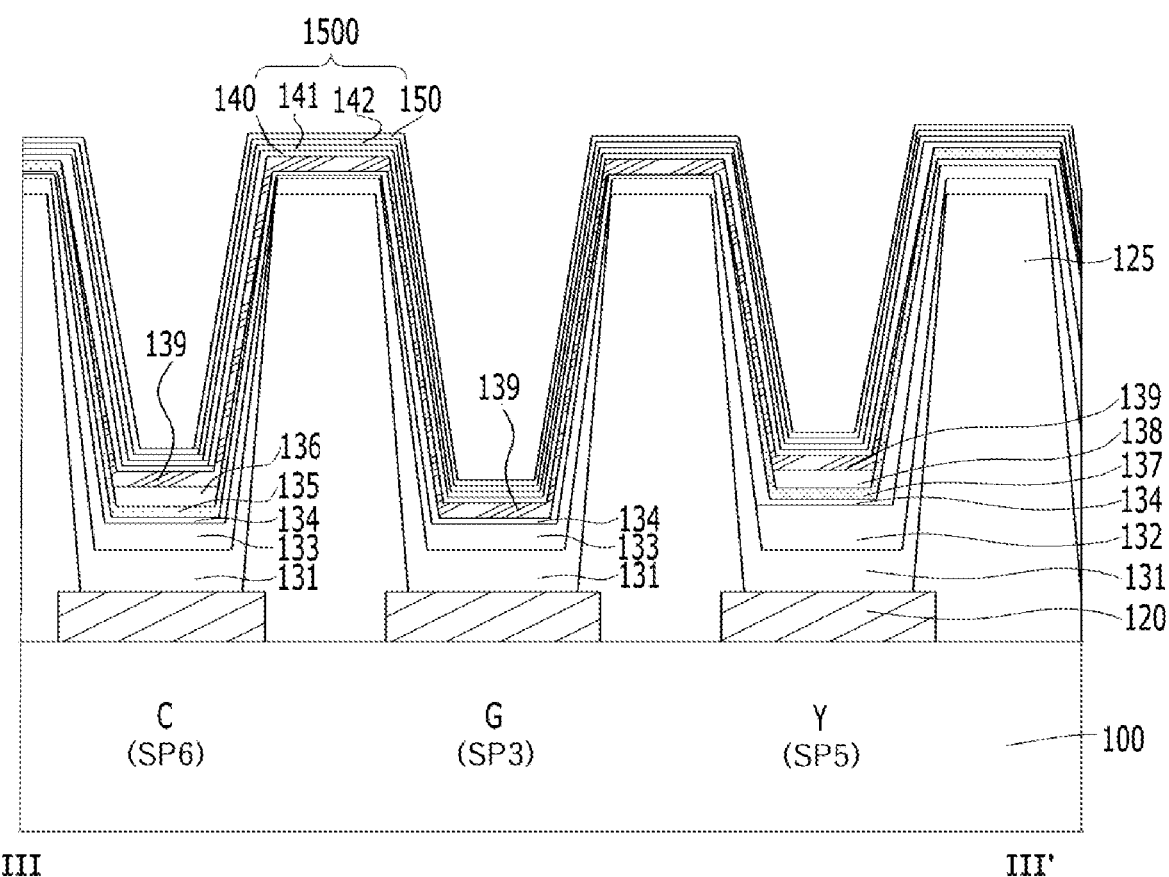

FIG. 2 is a plan view illustrating subpixel arrangement of a display device according to a first aspect of the present disclosure. FIG. 3 is a cross-sectional view taken along line I-I' of FIG. 2. FIGS. 4A and 4B are cross-sectional views taken along lines II-II' and III-III' of FIG. 2, respectively.

As illustrated in FIGS. 2 and 4B, in the display device according to the first aspect of the present disclosure, first to third subpixels SP1, SP2 and SP3 each having a single light emitting layer disposed at an odd-numbered position in each row and fourth to sixth subpixels SP4, SP5 and SP6 each having a plurality of light emitting layers disposed at an even-numbered position in the same row as that of the first to third subpixels SP1, SP2 and SP3 are disposed on a substrate 100. On the contrary, the first to third subpixels SP1, SP2 and SP3 each having a single light emitting layer may be disposed at an even-numbered position in each row, and the fourth to sixth subpixels SP4, SP5 and SP6 each having a plurality of light emitting layers may be disposed at an odd-numbered position in the same row as that of the first to third subpixels SP1, SP2 and SP3. The first to sixth subpixels SP1, SP2, SP3, SP4, SP5 and SP6, which perform emission of different colors, are disposed adjacent to one another in a row direction. The first to third subpixels SP1, SP2 and SP3 emit blue, red and green, respectively. The fourth to sixth subpixels SP4, SP5 and SP6, each of which includes two overlapping light emitting layers of associated ones of the first to third subpixels SP1, SP2 and SP3, emit secondary colors of the colors emitted from the first to third subpixels SP1, SP2 and SP3, namely, magenta, yellow and cyan, respectively. The same ones of the first to sixth subpixels SP1 to SP6 arranged in a matrix on the substrate 100 are diagonally aligned such that emission of the same color may be achieved in a diagonal direction. Such an arrangement is only illustrative, and other subpixel arrangements different from the diagonal arrangement may be possible. Rendering of white may be realized by either a combination of colors emitted from the odd-numbered subpixels SP1, SP2 and SP3 or a combination of colors emitted from the even-numbered subpixels SP4, SP5 and SP6.

In this case, the first to sixth subpixels SP1 to SP6 are arranged in each row in an order of the first subpixel SP1, the fourth subpixel SP4, the second subpixel SP2, the fifth subpixel SP5, the third subpixel SP3 and the sixth subpixel SP6.

In the display device according to the first aspect of the present disclosure, a total of three light emitting layers, that is, first to third light emitting layers 135, 137 and 139, is provided. The first to third light emitting layers 135, 137 and 139 are provided, as independent light emitting layers, at the first to third subpixels SP1, SP2 and SP3 to emit different colors, respectively. Each of the first to third light emitting layers 135, 137 and 139 extends from an associated one of the first to third subpixels SP1, SP2 and SP3 to ones of the fourth to sixth subpixels SP4 to SP6, which are disposed adjacent to the associated one of the first to third subpixels SP1, SP2 and SP3 respectively including the first to third light emitting layers 135, 137 and 139, and, as such, overlap of two independent light emitting layers is achieved in each of the fourth to sixth subpixels SP4 to SP6.

For example, the first light emitting layer 135 emits blue, and has a peak wavelength in a wavelength range of 430 to 480 nm. The second light emitting layer 137 emits red, and has a peak wavelength in a wavelength range of 600 to 650 nm. The third light emitting layer 138 emits green, and has a peak wavelength in a wavelength range of 500 to 580 nm.

That is, the first subpixel SP1 includes the first light emitting layer 135, which is a blue light emitting layer, as a single light emitting layer, and, as such, performs emission of blue. The second subpixel SP2 includes the second light emitting layer 137, which is a red light emitting layer, as a single light emitting layer, and, as such, performs emission of red. The third subpixel SP3 includes the third light emitting layer 139, which is a green light emitting layer, as a single light emitting layer, and, as such, performs emission of green.

On the other hand, the fourth subpixel SP4 includes an extension of the first light emitting layer 135, and an extension of the second light emitting layer 137 overlapping with the extension of the first light emitting layer 135 and, as such, achieves emission of a secondary color of blue and red, that is, magenta. The fifth subpixel SP5 includes an extension of the second light emitting layer 137, and an extension of the third light emitting layer 139 overlapping with the extension of the second light emitting layer 137 and, as such, achieves emission of a secondary color of red and green, that is, yellow. The sixth subpixel SP6 includes an extension of the third light emitting layer 139, and an extension of the first light emitting layer 135 overlapping with the extension of the third light emitting layer 139 and, as such, achieves emission of a secondary color of green and blue, that is, cyan.

A first electrode 120 is provided at each subpixel on the substrate 100. Common layers are formed in common at all subpixels. The first to third light emitting layers 135, 137 and 139 are formed at associated ones of the subpixels for emission of primary colors thereof, respectively. Each of the first to third light emitting layers 135, 137 and 139 extend over a total of three subpixels including one subpixel to emit an associated one of primary colors and two subpixels (mixed subpixels) disposed at opposite sides of the former subpixel. In particular, when each of the first to third light emitting layers 135, 137 and 139 extends one subpixel to emit the associated primary color and two subpixels disposed at opposite sides of the former subpixel, the light emitting layer 135, 137 or 139 is also formed over side walls and tops of banks 125 each disposed between adjacent ones of the subpixels. Referring to FIG. 2, the same ones of the first to sixth subpixels SP1 to SP6 on the substrate 100 are repeated in a diagonal direction. In this case, if the one light emitting layer extends continuously over three subpixels in a first row, the same light emitting layer as the former light emitting layer will extend continuously over three subpixels disposed in a second row at positions shifted by one subpixel position from those of the three subpixels in the first row. That is, in the first aspect, it may be possible to dispose the same light emitting layers in a column direction in a stepped shape while extending continuously over three subpixels in each row.

The example of FIG. 2 is only illustrative. The same ones of the first to sixth subpixels SP1 to SP6 may be disposed in the same column. In this case, each light emitting layer is disposed to extend over three subpixels in a vertical direction. In a similar manner, it may be also possible to dispose the light emitting layers such that each light emitting layer extends over three subpixels in a horizontal direction.

The substrate 100 may be made of a transparent insulating material, for example, glass or plastic. When the substrate 100 is made of plastic, the substrate 100 may be referred to as a "plastic film" or a "plastic substrate". When the substrate 100 is made of plastic, the substrate 100 may take the form of a film including one selected from the group essentially consisting of a polyimide-based polymer, a polyester-based polymer, a silicone-based polymer, an acryl-based polymer, a polyolefin-based polymer and copolymers thereof. Among these materials, polyimide is mainly used for a plastic substrate because polyimide may be applied to a high-temperature process and may have a coatability. "Substrate (array substrate)" may often be construed as a concept including elements and functional layers formed on the substrate, for example, switching thin film transistors (TFTs), driving TFTs connected to the switching TFTs, organic light emitting elements connected to the driving TFTs, a protective film, etc. The substrate 100 of FIG. 3 at least includes driving TFTs connected to light emitting diodes.

In addition, a buffer layer may be formed on the substrate 100 before formation of the driving TFTs. The buffer layer is a functional layer for protecting TFTs from impurities such as alkali ions discharged from the substrate 100 or layers disposed beneath the TFTs. The buffer layer may be made of a silicon oxide (SiOx) or a silicon nitride (SiNx), or may have a multilayer structure including layers of the materials.

TFTs are disposed on the substrate 100 or the buffer layer. Each TFT may have a laminated structure in which a semiconductor layer, a gate insulating film, a gate electrode, an interlayer insulating film, and source and drain electrodes are sequentially disposed. The semiconductor layer is disposed on the substrate 100 or the buffer layer. The semiconductor layer may be made of polysilicon (p-Si). In this case, the semiconductor layer may be doped with impurities in a predetermined region thereof. Alternatively, the semiconductor layer may be made of amorphous silicon (a-Si) or various organic semiconductor materials, for example, pentacene. The semiconductor layer may also be made of an oxide. The gate insulating film may be made of an inorganic substance having an insulation property such as a silicon oxide (SiOx) or a silicon nitride (SiNx). Alternatively, the gate insulating film may be made of an organic substance having an insulation property. The gate electrode may be made of various conductive materials, for example, magnesium (Mg), aluminum (Al), nickel (Ni), chromium (Cr), molybdenum (Mo), tungsten (W), gold (Au) or alloys thereof.

The interlayer insulating film may be made of an insulating material such as a silicon oxide (SiOx) or a silicon nitride (SiNx). Alternatively, the interlayer insulating film may be made of an organic substance having an insulation property. Contact holes, through which source and drain regions are exposed, may be formed in accordance with selective removal of the interlayer insulating film and the gate insulating film.

The source and drain electrodes are formed on the interlayer insulating film, to have a multilayer structure, using an electrode material. A planarization layer may be disposed on the TFTs. The planarization layer protects the TFTs while planarizing an upper surface of the resulting structure including the TFTs. The planarization layer may have various structures. For example, the planarization layer may be formed of an organic insulating film made of, for example, benzocyclobutene (BCB) or acryl, or an inorganic insulating film such as a silicon nitride (SiNx) film or a silicon oxide (SiOx) film. In addition, the polarization layer may have a single-layer structure, a double-layer structure, or a multilayer structure. As such, the polarization film may have various structures.

The substrate 100 as illustrated may have a configuration including the buffer layer, the TFTs, and even the polarization layer. The planarization film is selectively removed to partially expose the drain electrode of each TFT so that the drain electrode of the TFT is connected to the light emitting diode provided at an associated one of the subpixels, in more detail, the first electrode 120 of the associated subpixel.

The first electrodes 120 are formed at the subpixels SP1 to SP6, respectively. The first electrodes 120 are separated from one another and, as such, may receive independent signals, respectively. The banks 125 are provided at boundaries of adjacent ones of the subpixels such that the banks 125 partially overlap with associated ones of the first electrodes 120, respectively, and, as such, emission parts are defined by areas open through the banks 125. Each bank 125 is made of an organic insulating material such as BCB, an acryl-based resin or an imide-based resin. Each bank 125 is formed to have a sufficient thickness to prevent passage of light through an area where the bank 125 is formed, for example, a thickness of 1 to 3.5 µm. The banks 125 may be formed through a photolithography process generally requiring light exposure and development. To this end, the banks 125 have a high film formation density and a great thickness, as compared to an organic substance layer disposed between the first and second electrodes of the light emitting diodes deposited through vapor evaporation. Each bank 125 substantially has a greater thickness than the thickness of a laminated structure of organic substances in each light emitting diode, which is defined by the thickness between the first and second electrodes in each light emitting part. Each bank 125 may have a laminated structure including a bank constituted by an organic substance layer and a bank constituted by an inorganic layer while being disposed beneath the former bank. If necessary, the banks 125 may be made of a light shieldable material in order to prevent color mixture between adjacent ones of the subpixels caused by light laterally introduced into the banks 125.

Hereinafter, lamination orders of the first to sixth subpixels SP1 to SP6 will be described.

First, a lamination order of the first subpixel SP1 to emit blue will be described. At the first subpixel SP1, a hole transport layer 131, an electron blocking layer 134, a first light emitting layer 135 to emit blue, a hole blocking layer 140, an electron transport layer 141 and a second electrode 142 are sequentially formed on a first electrode 120 in this order and, as such, a light emitting diode of the first subpixel SP1 is formed. A capping layer 150 is then formed to protect the light emitting diode.

At the second subpixel SP2, the hole transport layer 131, a first auxiliary hole transport layer 132 to adjust an optimal emission zone for red having a relatively long wavelength through variation of a vertical distance thereof from the first electrode 120, an electron blocking layer 134, a second light emitting layer 137 to emit red, the hole blocking layer 140, an electron transport layer 141 and a second electrode 142 are sequentially formed on a first electrode 120 in this order and, as such, a light emitting diode of the second subpixel SP2 is formed.

At the third subpixel SP3, a hole transport layer 131, a second auxiliary hole transport layer 133 to adjust an optimal emission zone for green through variation of a vertical distance thereof from a first electrode 120, taking into consideration a wavelength difference between red and green, the electron blocking layer 134, a third light emitting layer 139 to emit red, a hole blocking layer 140, an electron transport layer 141 and a second electrode 142 are sequentially formed on the first electrode 120 in this order and, as such, a light emitting diode of the third subpixel SP3 is formed.

At the fourth subpixel SP4, which is disposed between the first subpixel SP1 and the second subpixel SP2, a hole transport layer 131, an electron blocking layer 134, a first light emitting layer 135 to emit blue, a first charge generation layer 136, a second light emitting layer 137 to emit red, a hole blocking layer 140, an electron transport layer 141 and a second electrode 142 are sequentially formed on a first electrode 120 in this order and, as such, a light emitting diode of the fourth subpixel SP4 is formed. The first light emitting layer 135 of the fourth subpixel SP4 to emit blue is an extension of the first light emitting layer 135 provided at the first subpixel SP1. These first light emitting layers 135 are integrally formed through an opening of a single fine metal mask (FMM). Similarly, the second light emitting layer 137 of the fourth subpixel SP4 is an extension of the second light emitting layer 137 provided at the second subpixel SP2. These second light emitting layers 137 are integrally formed through an opening of a single fine metal mask (FMM). In this case, the width of the opening of the fine metal mask for formation of the light emitting layers of the same color corresponds to three times the width of the emission part of each subpixel.

At the fifth subpixel SP5, which is disposed between the second subpixel SP2 and the third subpixel SP3, a hole transport layer 131, a first auxiliary hole transport layer 132, an electron blocking layer 134, a second light emitting layer 137 to emit red, a second charge generation layer 138, a third light emitting layer 139 to emit green, a hole blocking layer 140, an electron transport layer 141 and a second electrode 142 are sequentially formed on a first electrode 120 in this order and, as such, a light emitting diode of the fifth subpixel SP5 is formed. The second and third light emitting layers 137 and 139 of the fifth subpixel SP5 are extensions of the light emitting layers provided at the second and third subpixels SP2 and SP3, respectively.

At the sixth subpixel SP6, which is disposed between the third subpixel SP3 and the first subpixel SP1, a hole transport layer 131, a second auxiliary hole transport layer 133, an electron blocking layer 134, a first light emitting layer 135 to emit blue, a first charge generation layer 136, a third light emitting layer 139 to emit green, a hole blocking layer 140, an electron transport layer 141 and a second electrode 142 are sequentially formed on a first electrode 120 in this order and, as such, a light emitting diode of the sixth subpixel SP6 is formed. The first and third light emitting layers 135 and 139 of the sixth subpixel SP6 are extensions of the light emitting layers provided at the first and third subpixels SP1 and SP3, respectively. In this case, the width of the opening of the fine metal mask for formation of the light emitting layers of the same color corresponds to three times the width of the emission part of each subpixel, as described above.

Similarly to the first subpixel SP1, capping layers 150 are formed in common on the second electrodes 142 of the subpixels SP2 to SP6, to protect the light emitting diodes of the subpixels SP2 to SP6. All capping layers 150 may be simultaneously formed in an organic substance deposition process. The material of the capping layers 150 may be an organic substance or an inorganic substance. The capping layers 150 are integrally formed to cover a plurality of subpixels provided at the substrate 100. If necessary, the capping layers 150 may be constituted by a plurality of layers having different indexes of refraction. Furthermore, the capping layers 150 may have different thicknesses in order to exhibit different light extraction effects at associated ones of the subpixels.

The hole transport layers 131, the first and second auxiliary hole transport layers 132 and 133, and the electron blocking layers 134 are made of organic substances having a hole transport property. Among these layers, the hole transport layers 131 and the electron blocking layers 134 are common layers formed in common at all subpixels. The electron blocking layers 134 have particular functional characteristics in that the electron blocking layers 134 prevent escape of electrons from associated ones of the light emitting layers. Accordingly, HOMO/LUMO energy levels of the electron blocking layers 134 may be adjusted to differ from those of the light emitting layers. To this end, the host material of the electron blocking layers 134 may have a LUMO energy level different from those of the light emitting layers by predetermined values, or may further include a particular dopant in order to prevent electron mobility.

Each first auxiliary hole transport layer 132 is a layer provided to adjust an appropriate emission zone of the red light emitting layer, and the material thereof is an organic substance having a hole transport property. Each second auxiliary hole transport layer 133 is a layer provided to adjust an appropriate emission zone of the green light emitting layer, and the material thereof is an organic substance having a hole transport property. The first auxiliary hole transport layer 132 at each subpixel having the red light emitting layer to emit red light of a relatively long wavelength has a greater thickness than the second auxiliary hole transport layer 133 at each subpixel having the green light emitting layer to emit green light of a relatively short wavelength in order to adjust the resonance generation zone of each light emitting layer between the first electrode 120 and the second electrode 142.

Meanwhile, the first auxiliary hole transport layers 132 may be provided at subpixels such as the second subpixel SP2 having a single red light emitting layer and the fifth subpixel SP5 having a red light emitting layer as one of a plurality of light emitting layers. However, if necessary, the first auxiliary hole transport layers 132 may be omitted from subpixels even when the subpixels have the second light emitting layer 137 to emit red, as in the fourth subpixel SP4, so long as another light emitting layer, for example, the first light emitting layer 135, is disposed beneath the second light emitting layer 137 and, as such, an emission zone of the second light emitting layer 137 may be secured.

In addition, each of the first and second charge generation layers 136 and 138 is disposed between different light emitting layers, and may have a laminated structure of an n-type charge generation layer to supply electrons to a lower one of the light emitting layers for supplement of a shortage of electrons and a p-type charge generation layer to supply holes to an upper one of the light emitting layers for supplement of a shortage of holes.

The hole blocking layer 140 and the electron transport layer 141 are disposed, as common layers, over the light emitting layer disposed at an uppermost position in each subpixel. The hole blocking layer 140 has particular functional characteristics in that the electron blocking layer 134 prevents escape of electrons from light emitting layers. Accordingly, HOMO/LUMO energy levels of the electron blocking layer 134 may be adjusted to differ from those of the light emitting layers. To this end, the host material of the electron blocking layer 134 may have a LUMO energy level different from those of the light emitting layers by predetermined values, or may further include a particular dopant in order to prevent electron mobility.

The hole blocking layers 140, the electron transport layers 141, the second electrodes 142 and the capping layers 150 are collectively referred to as an "upper common stack" in that those layers are disposed in common over the light emitting layers of all subpixels, and may be formed using the same common mask. The layers included in the upper common stack, which is designated by reference numeral "1500", are formed to cover subpixels on the substrate, using a common mask having an opening corresponding to an active area including at least a plurality of subpixels. If necessary, the mask may have an opening size increasing as the opening extends upwards such that an upper one of the layers covers a lower one of the layers.

In the display device according to the first aspect of the present disclosure, the first light emitting layer 135, the second light emitting layer 137 and the third light emitting layer 139 are provided at the first to third subpixels SP1 to SP3 to perform independent light emission, respectively. Each light emitting layer extends to subpixels disposed at opposite sides of the subpixel performing independent light emission of the light emitting layer. That is, the first light emitting layer 135 is formed not only at the first subpixel SP1, but also at the first subpixel SP4 and the sixth subpixel SP6 disposed adjacent to opposite sides of the first subpixel SP1. As such, the first light emitting layer 135 is formed to extend over a total of three subpixels, that is, the subpixels SP1, SP4 and SP6. Similarly, the second light emitting layer 137 is formed not only at the second subpixel SP2, but also at the fourth subpixel SP4 and the fifth subpixel SP5 disposed adjacent to opposite sides of the second subpixel SP2. As such, the second light emitting layer 137 is formed to extend over a total of three subpixels, that is, the subpixels SP2, SP4 and SP5. Similarly, the third light emitting layer 139 is formed not only at the third subpixel SP3, but also at the fifth subpixel SP5 and the sixth subpixel SP6 disposed adjacent to opposite sides of the third subpixel SP3. As such, the third light emitting layer 139 is formed to extend over a total of three subpixels, that is, the subpixels SP3, SP5 and SP6.

Figure 5:
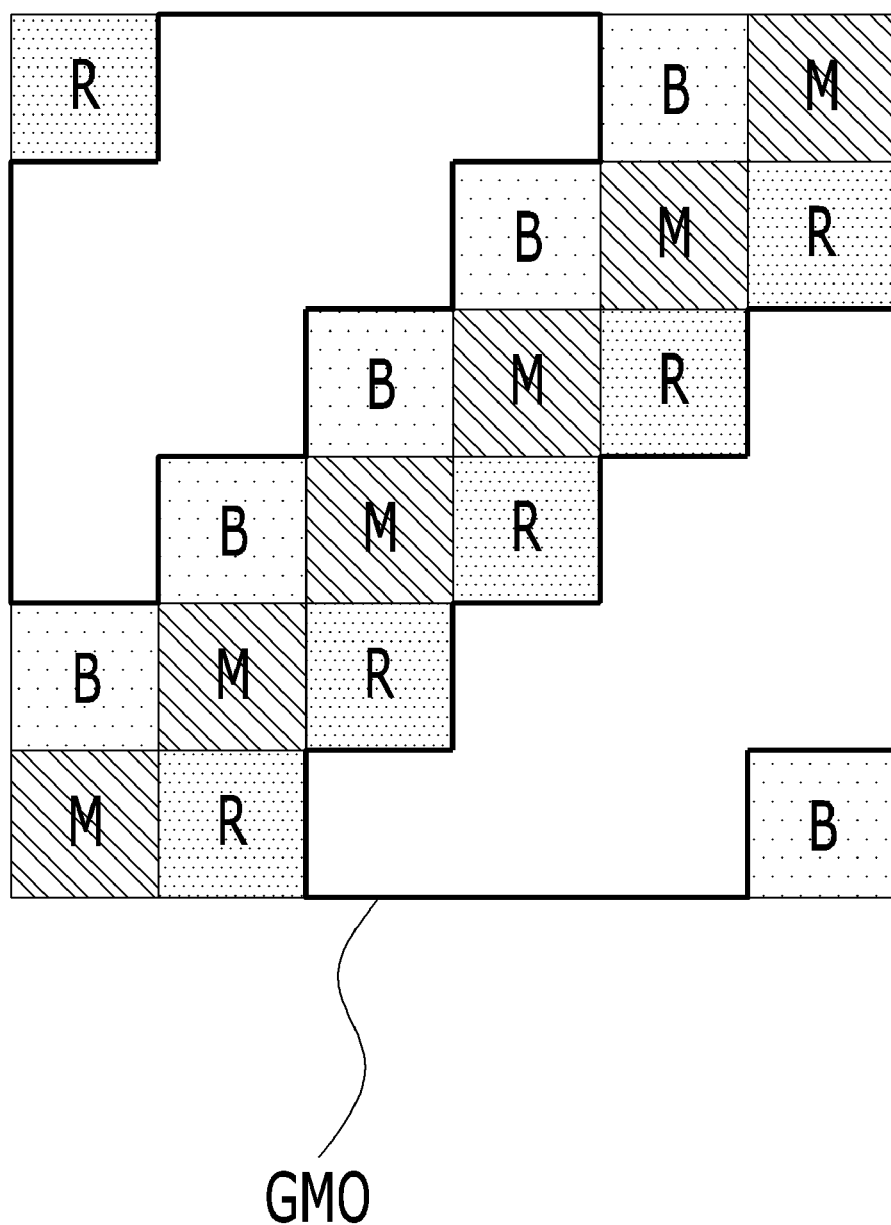
FIG. 5 is a plan view illustrating openings of a fine metal mask corresponding to green light emitting layers in the display device according to the first aspect of the present disclosure.

FIG. 5 is a plan view illustrating openings of the fine metal mask corresponding to the green light emitting layers in the display device according to the first aspect of the present disclosure.

As illustrated in FIG. 5, each light emitting layer of the display device according to the first aspect of the present disclosure is disposed at a total of three continuous subpixels. For such disposition of each light emitting layer, the light emitting layer is formed through a fine metal mask having openings each extending over three subpixels.

FIG. 5 illustrates a fine metal mask corresponding to green light emitting layers. When subpixels to emit six different colors R, Y, G, C, B and M are disposed in one row, the fine metal mask is provided with an opening GMO for a green light emitting layer corresponding to three continuous subpixels among the six subpixels in the same row as that of the six subpixels. In a next row, the fine metal mask is provided with an opening GMO for a green light emitting layer corresponding to three continuous subpixels at a position shifted left from that of the opening in the former row by one subpixel. In such a manner, openings of the fine metal mask are arranged while being shifted from one another when viewed in a vertical direction, to have a stepped shape.

Meanwhile, openings of a fine metal mask for red light emitting layers overlap with the illustrated openings of the fine metal mask for the green light emitting layers by a width corresponding to one subpixel at a left side in each row while having the same shape as those of the fine metal mask for the green light emitting layers.

In addition, openings of a fine metal mask for blue light emitting layers overlap with the illustrated openings of the fine metal mask for the green light emitting layers by a width corresponding to one subpixel at a right side in each row.

In this case, each light emitting layer is formed over a total of three subpixels and, as such, emission parts may be formed at three divisional areas of the light emitting layer, respectively. Accordingly, the display device according to the first aspect of the present disclosure may obtain resolution corresponding to three times the resolution obtained at a minimum light emitting layer size.

In this case, referring to FIGS. 1 to 4B, a method for manufacturing the display device of the present disclosure includes steps of forming first electrodes 120 at a plurality of subpixels SP1 to SP6, forming first to third light emitting layers on the first electrodes 120 such that the first to third light emitting layers are disposed at a part of the subpixels SP1 to SP6 as single light emitting layers, respectively, thereby defining reference or primary subpixels S1 (SP1, SP2 and SP3), and at least two of the first to third light emitting layers overlap with each other at the remaining part of the subpixels SP1 to SP6, thereby defining secondary subpixels S2 (SP4, SP5 and SP6), and forming a second electrode 142 on the first to third light emitting layers, to extend over the primary and secondary pixels S1 and S2.

A charge generation layer (CGL) 136 or 138 is formed between at least two light emitting layers 135 and 137/137 and 139/135 and 139 of the secondary subpixels S2 (SP4, SP5 and SP6) where at least two of the light emitting layers overlap with each other.

In a step of defining the primary and secondary subpixels S1 and S2, each of the first to third light emitting layers 135, 137 and 139 may be formed at two or more subpixels SP.

Figure 6A:
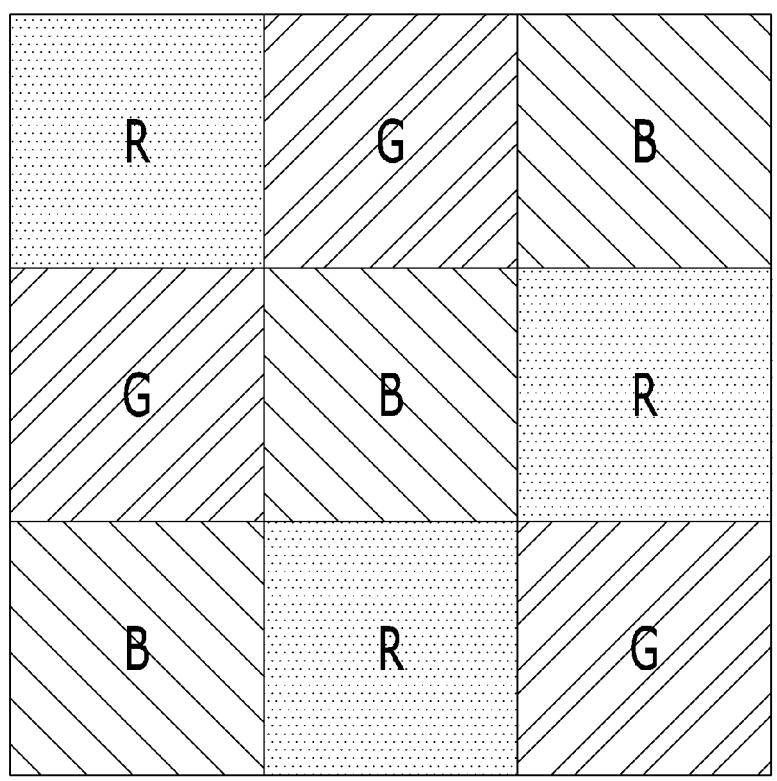
FIGS. 6A and 6B are plan views illustrating arrangements of subpixels in a display device according to a comparative example and the display device of the present disclosure, respectively.
Figure 6B:
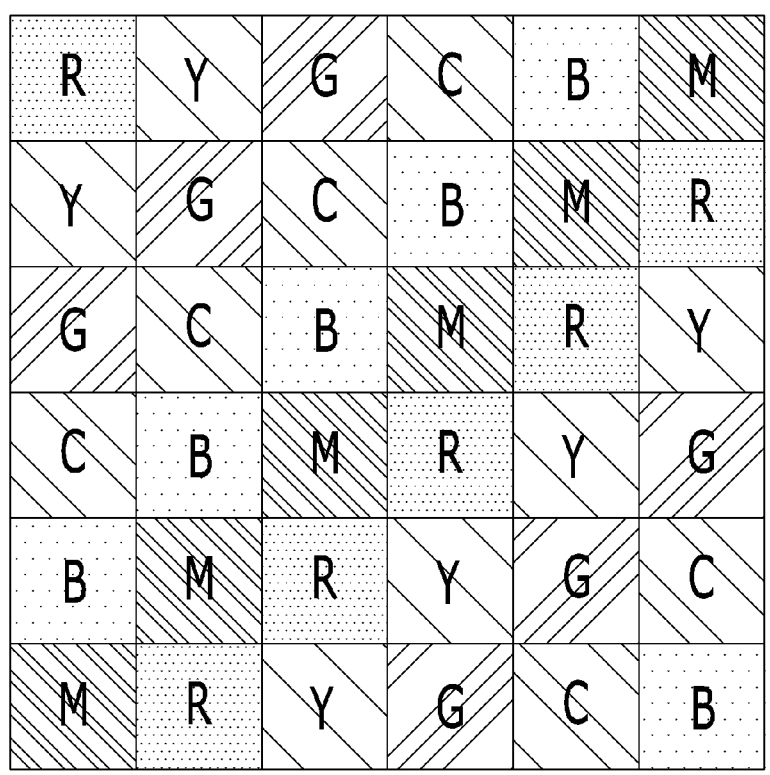

FIGS. 6A and 6B are plan views illustrating arrangements of subpixels in a display device according to a comparative example and the display device of the present disclosure, respectively.

As illustrated in FIG. 6A, the display device according to the comparative example has a configuration including red, green and blue subpixels, that is, subpixels of three primary colors, and light emitting layers provided at respective subpixels while corresponding in color to respective subpixels.

As illustrated in FIG. 6A, in the display device according to the comparative example, the same ones of the red, green and blue light emitting layers are aligned in a diagonal direction. The area where each light emitting layer is formed functions as a subpixel to emit a color corresponding to that of the light emitting layer. In the display device according to the comparative example, a total of three subpixels, that is, red, green and blue subpixels, are defined.

On the other hand, as illustrated in FIG. 6B, the display device of the present disclosure includes subpixel sets each including a total of six subpixels to emit different colors, that is, a red subpixel R, a yellow subpixel Y, a green subpixel a cyan subpixel C, a blue subpixel B and a magenta subpixel M, and R, G and B light emitting layers. In each subpixel set, each of the R, G and B light emitting layers is divided into three portions, that is, a central portion and opposite side portions, and the central portion of each light emitting layer is disposed at an associated one of the subpixels configured to have a single light emitting layer, and the opposite side portions of the light emitting layer are disposed at the subpixels disposed at opposite sides of the former subpixel and configured to have two overlapping light emitting layers, respectively. In the display device of the present disclosure, the same ones of the light emitting layers are aligned in a diagonal direction, as illustrated in FIG. 6. Although the display device of the present disclosure is provided with the same number of light emitting materials as the comparative example, each light emitting layer in the display device of the present disclosure may be divided to provide the number of subpixels corresponding to twice that of the comparative example in rows and columns of the same area. As a result, the display device of the present disclosure may have resolution corresponding to 4 times the resolution obtained in the comparative example when a fine metal mask (FMM) having the same scale as that of the comparative example is used for formation of light emitting layers in the present disclosure.

Figure 7A:
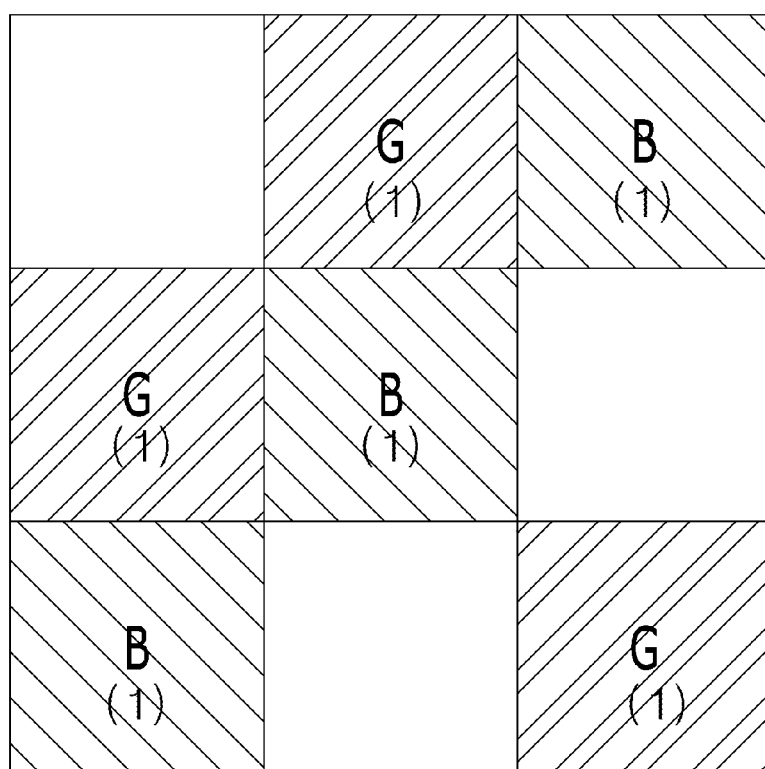
FIGS. 7A and 7B are plan views illustrating brightness required in the display device according to the comparative example and brightness required in the display device of the present disclosure for the same cyan rendering, respectively.
Figure 7B:
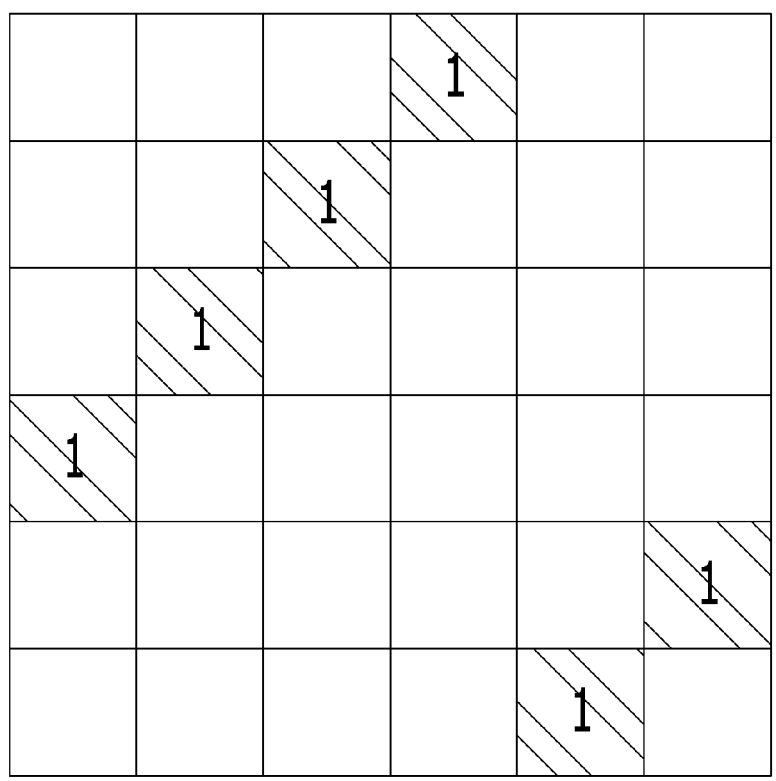

FIGS. 7A and 7B are plan views illustrating brightness required in the display device according to the comparative example and brightness required in the display device of the present disclosure for the same cyan rendering, respectively.

In the display device according to the comparative example, the subpixels thereof are constituted only by subpixels of primary colors, that is, red, green and blue, as illustrated in FIG. 7A, and, as such, green and blue subpixels should be simultaneously turned on when it is necessary to render cyan which is a secondary color. Assuming that brightness required in each subpixel to emit cyan in the display device of the present disclosure is 1, the display device of the comparative example requires a subpixel area corresponding to 4 times or more the area required in the display device of the present disclosure to drive the subpixel to emit render cyan alone because, in the display device of the comparative example, adjacent green and blue subpixels thereof should be simultaneously turned on at the same brightness for rendering of cyan. Furthermore, for driving of each subpixel, the thin film transistor connected to the light emitting element including the light emitting layer associated with the subpixel should be turned on In this connection, for rendering of cyan, the number of the thin film transistors to be driven in the display device of the comparative example is increased as compared to that of the present disclosure. As a result, there may be a problem of an increase in power consumption in the comparative example corresponding to the increased number of thin film transistors to be driven in that a predetermined voltage level or greater is required for turn-on of each thin film transistor. In addition, in the comparative example, double subpixels are required for rendering of cyan and, as such, resolution is reduced to ¼ of the resolution obtained in the structure of the present disclosure. Furthermore, in a fine metal mask having a structure in which an opening of the fine metal mask is defined to correspond to the size of each light emitting layer, as in the comparative example, there may be a limitation in realizing an opening size equal to or smaller than a predetermined size, taking into consideration loosening of the mask. For this reason, there may be a problem in that, when a complex color such as magenta, cyan or yellow is rendered, a minimum unit of color rendering is increased, as compared to the case in which a single color is rendered.

As apparent from the above description, the display device of the present disclosure has effects in terms of resolution and power consumption, as compared to the comparative example in which each subpixel is embodied by a single light emitting layer.

Hereinafter, display devices according to other aspects having the same effects as those of the above-described display device will be described.

Figure 8:
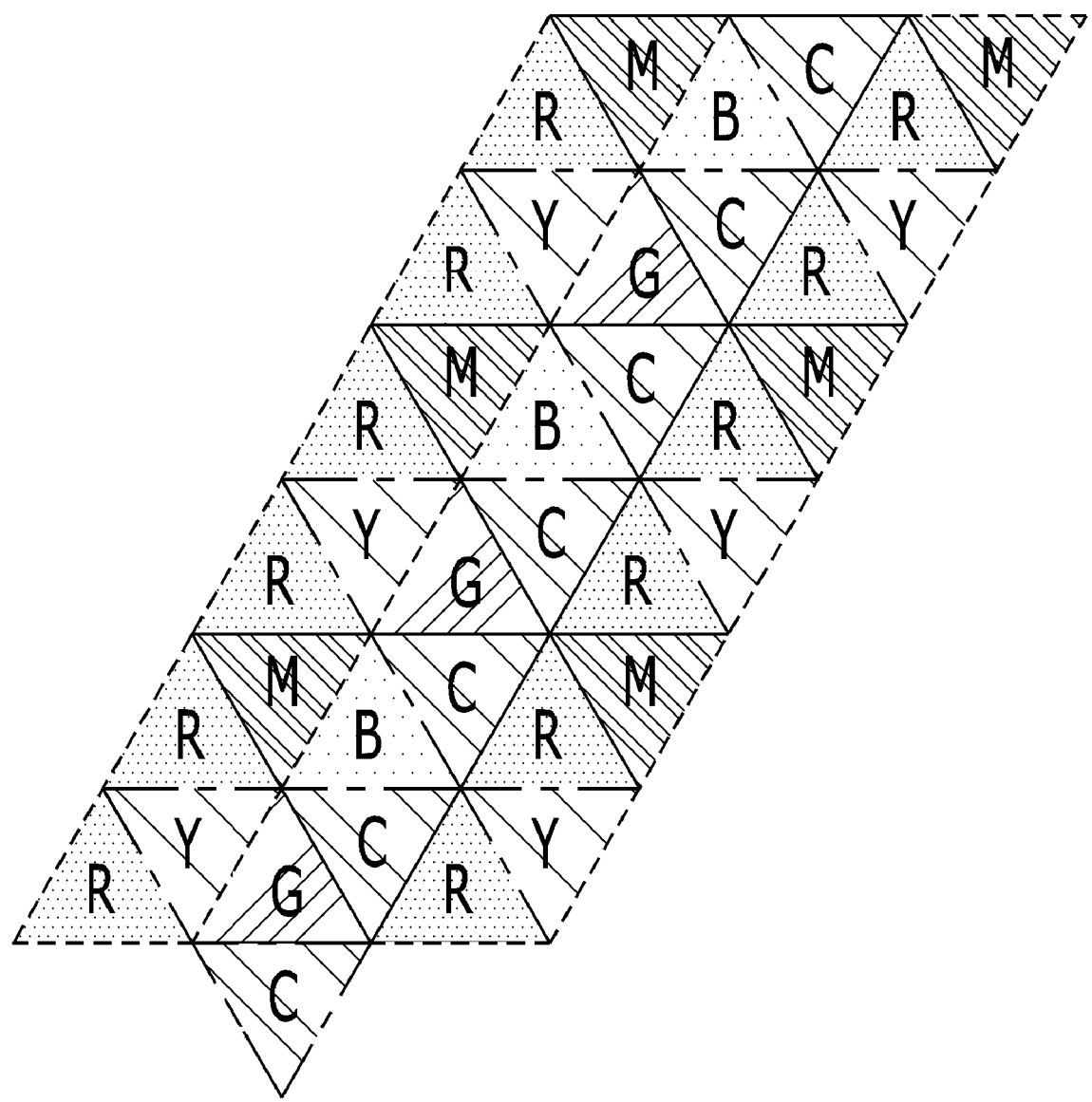
FIG. 8 is a plan view illustrating subpixel arrangement of a display device according to a second aspect of the present disclosure.
Figure 9A:
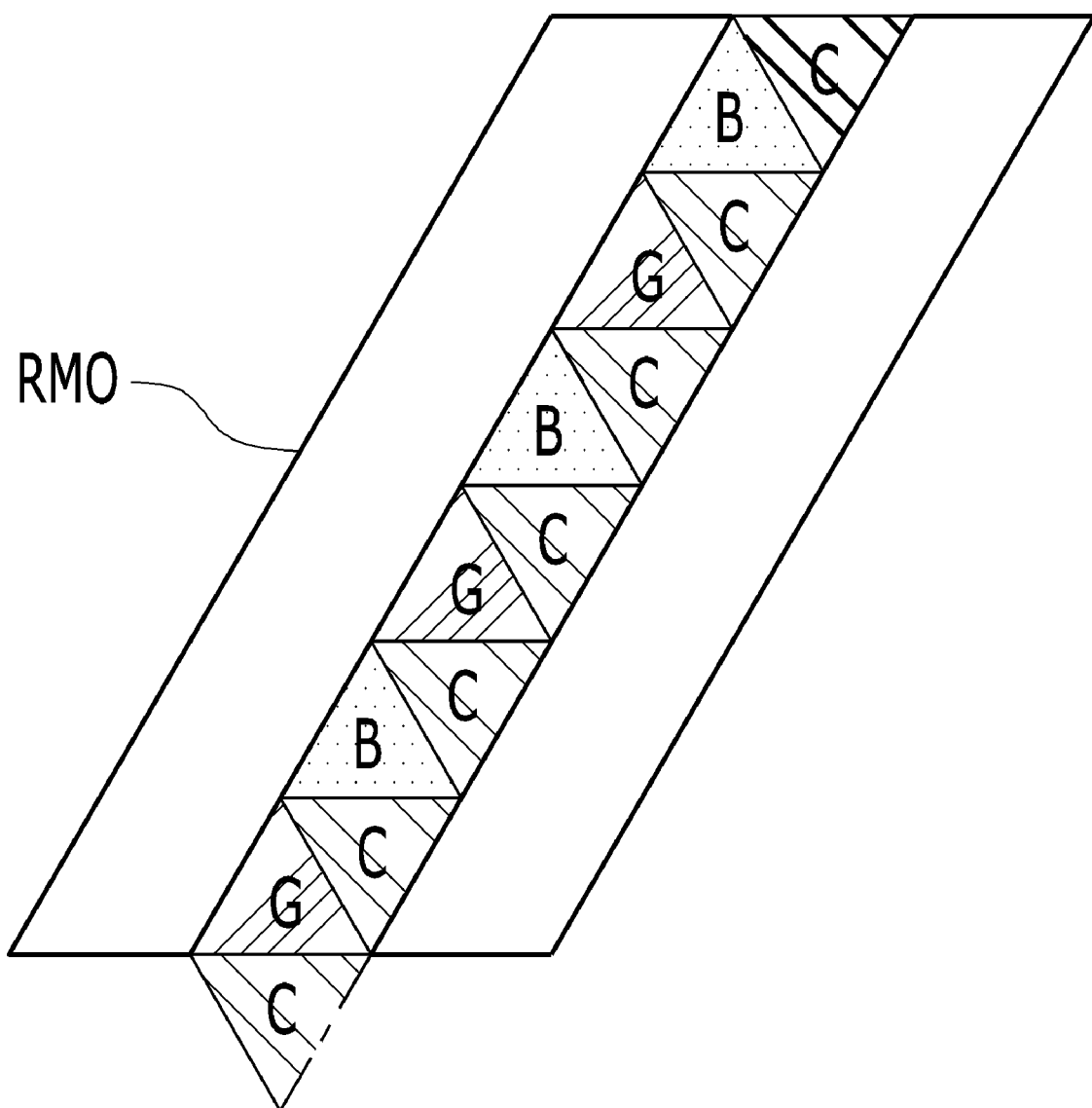
FIGS. 9A to 9C are plan views illustrating masks for formation of first to third light emitting layers of FIG. 8, respectively.
Figure 9B:
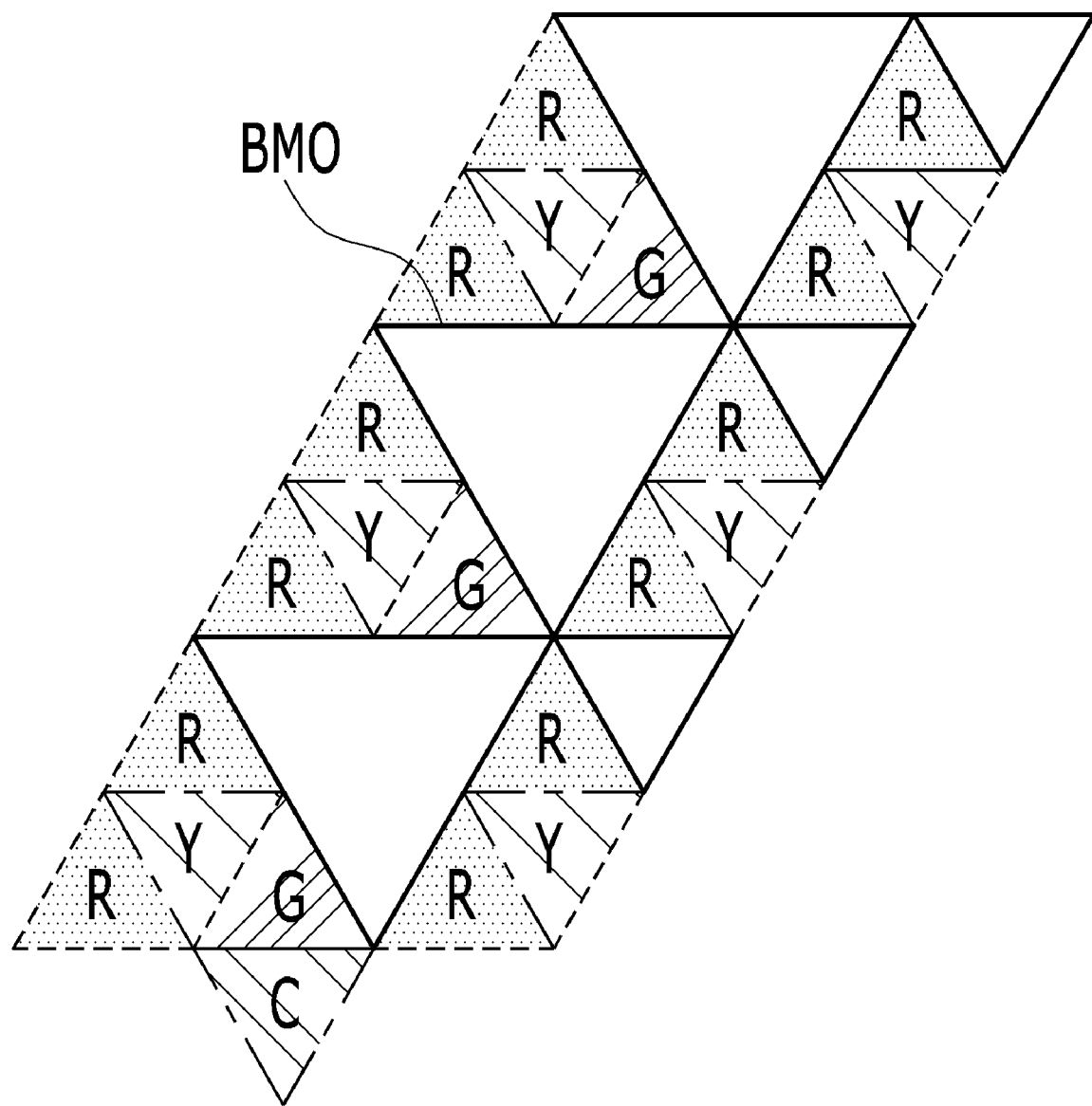
Figure 9C:
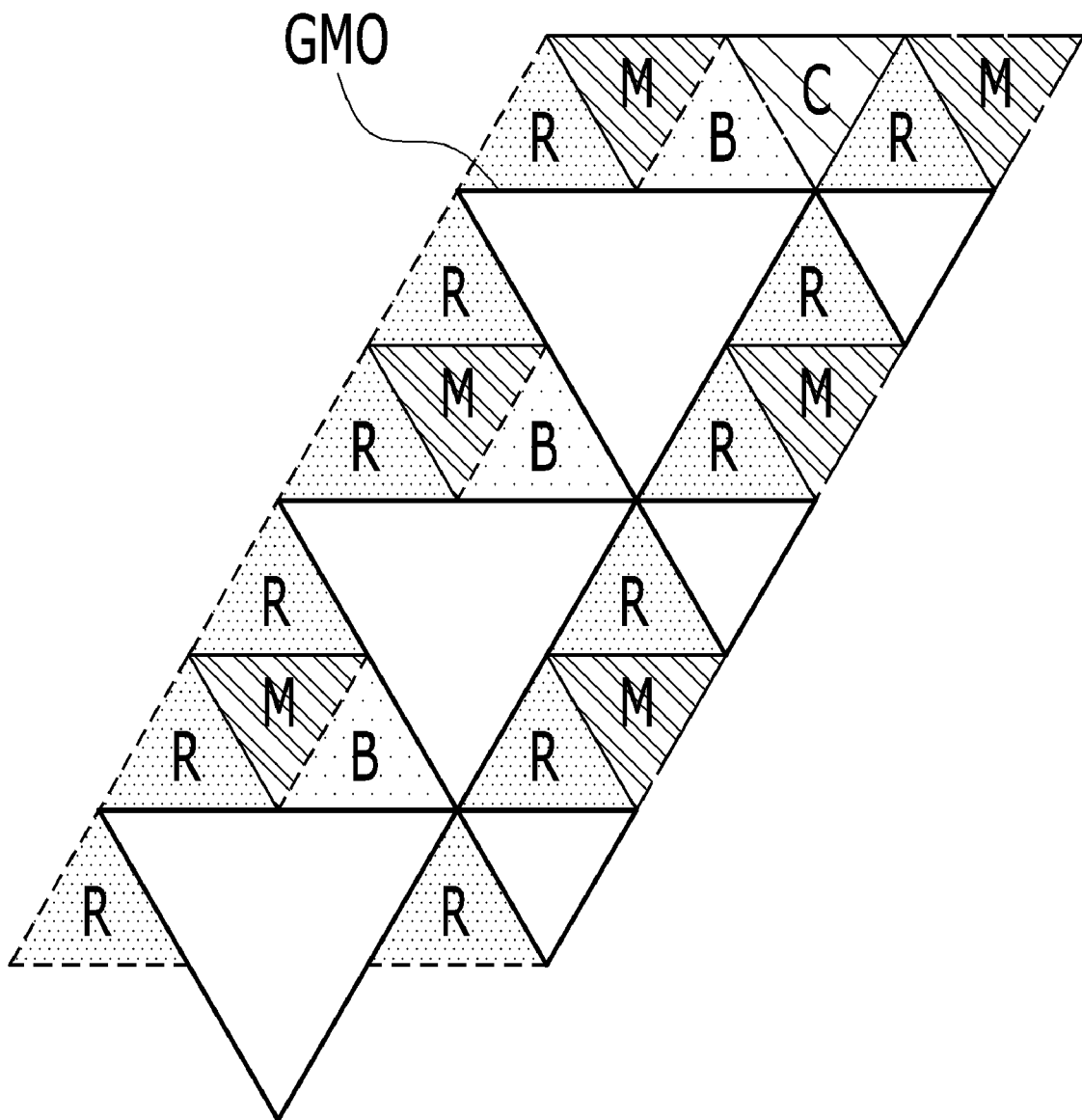

FIG. 8 is a plan view illustrating subpixel arrangement of a display device according to a second aspect of the present disclosure. FIGS. 9A to 9C are plan views illustrating masks for formation of first to third light emitting layers of FIG. 8, respectively.

In the display device according to the second aspect of the present disclosure, as illustrated in FIG. 8, subpixels are arranged at six divisional portions of each hexagonal area in a clockwise order or in a counterclockwise order, respectively. That is, a red subpixel, a magenta subpixel, a blue subpixel, a cyan subpixel, a green subpixel and a yellow subpixel are arranged in this order in each hexagonal area.

The display device according to the second aspect differs from that of the first aspect only in terms of planar arrangement of subpixels in that subpixels in the first aspect are arranged in rows and columns, whereas subpixels in the second aspect are arranged in a clockwise or counterclockwise direction around the center of each hexagonal area. The cross-section taken along line crossing different subpixels in the second aspect may be identical to that of FIG. 3.

That is, the second aspect is identical to the first aspect in that each of the red, green and blue subpixels has a single light emitting layer, and each of the yellow, cyan and magenta subpixels has a double-layer structure including two light emitting layers arranged vertically to overlap with each other and, as such, no description will be given of the same structure.

As illustrated in FIG. 9A, openings RMO of a fine metal mask for formation of red light emitting layers are aligned in a diagonal direction. In this case, each opening RMO of the fine metal mask occupies a half of each hexagonal subpixel area including six different subpixels.

As illustrated in FIGS. 9B and 9C, openings BMO and GMO of fine metal masks for formation of blue light emitting layers and green light emitting layers have a triangular shape. When each opening BMO or GMO is divided into fourth triangular portions each having a size corresponding to each subpixel, one triangular portion of each opening BMO or GMO overlaps with a corresponding one of the openings RMO of the fine metal mask for formation of the red light emitting layers. In this case, positions where the triangular portions of the openings BMO overlap with each opening RMO differ from positions where the triangular portions of the openings GMO overlap with the opening RMO.

Meanwhile, arrangement of colors may be varied. For example, the fine metal mask of FIG. 9A, which has parallelogram openings, may be used for formation of green or blue light emitting layers, in place of formation of red light emitting layers. Arrangement of blue or green as illustrated in FIG. 9B or 9C may also be varied through application of the mask for formation of light emitting layers different from those of blue or green.

Figure 10:
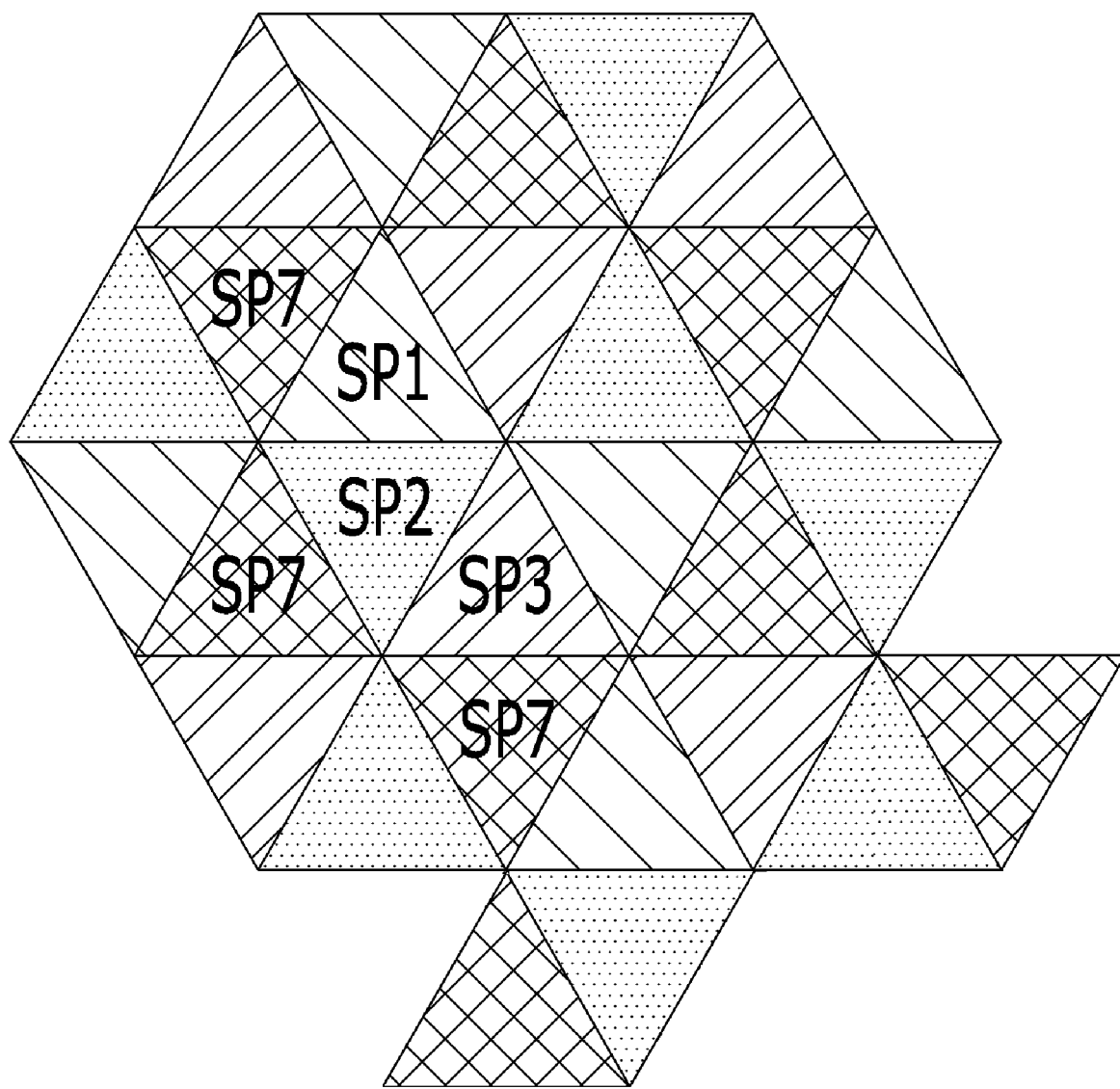
FIG. 10 is a plan view illustrating subpixel arrangement of a display device according to a third aspect of the present disclosure.
Figure 11B:
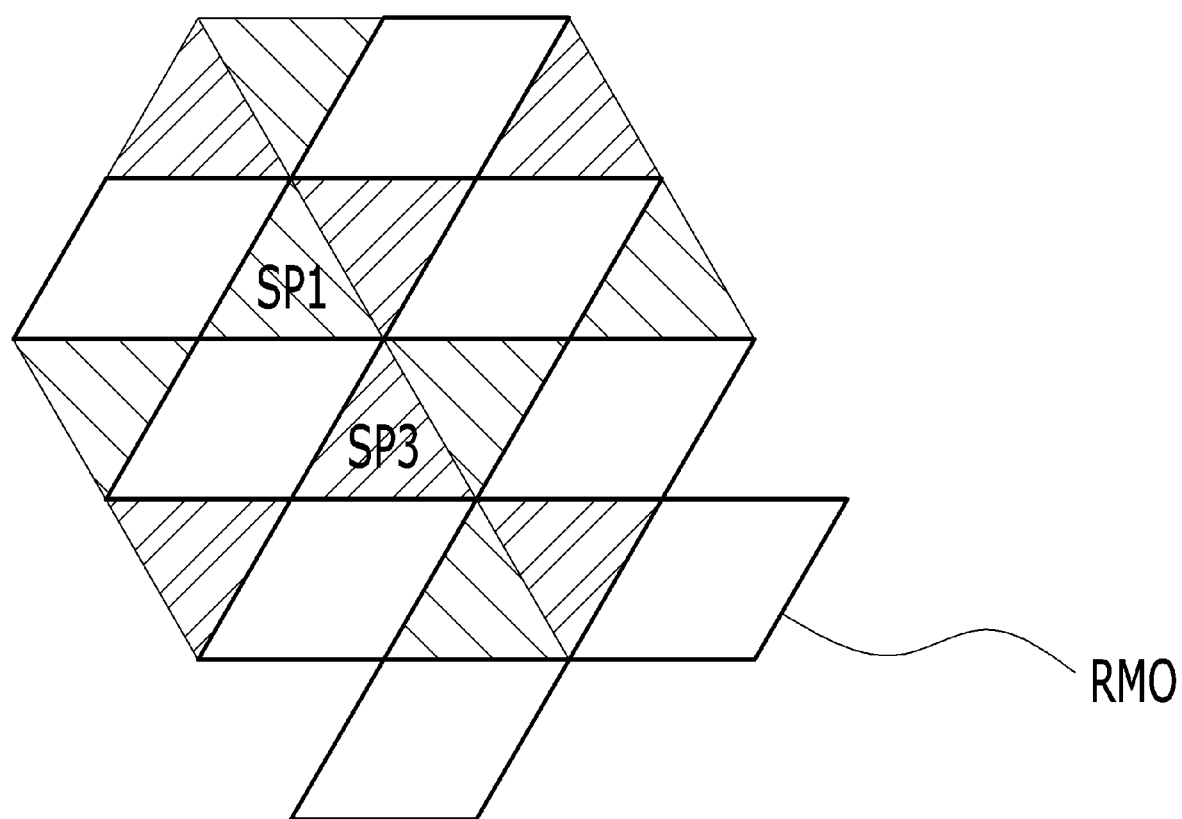
Figure 11C:
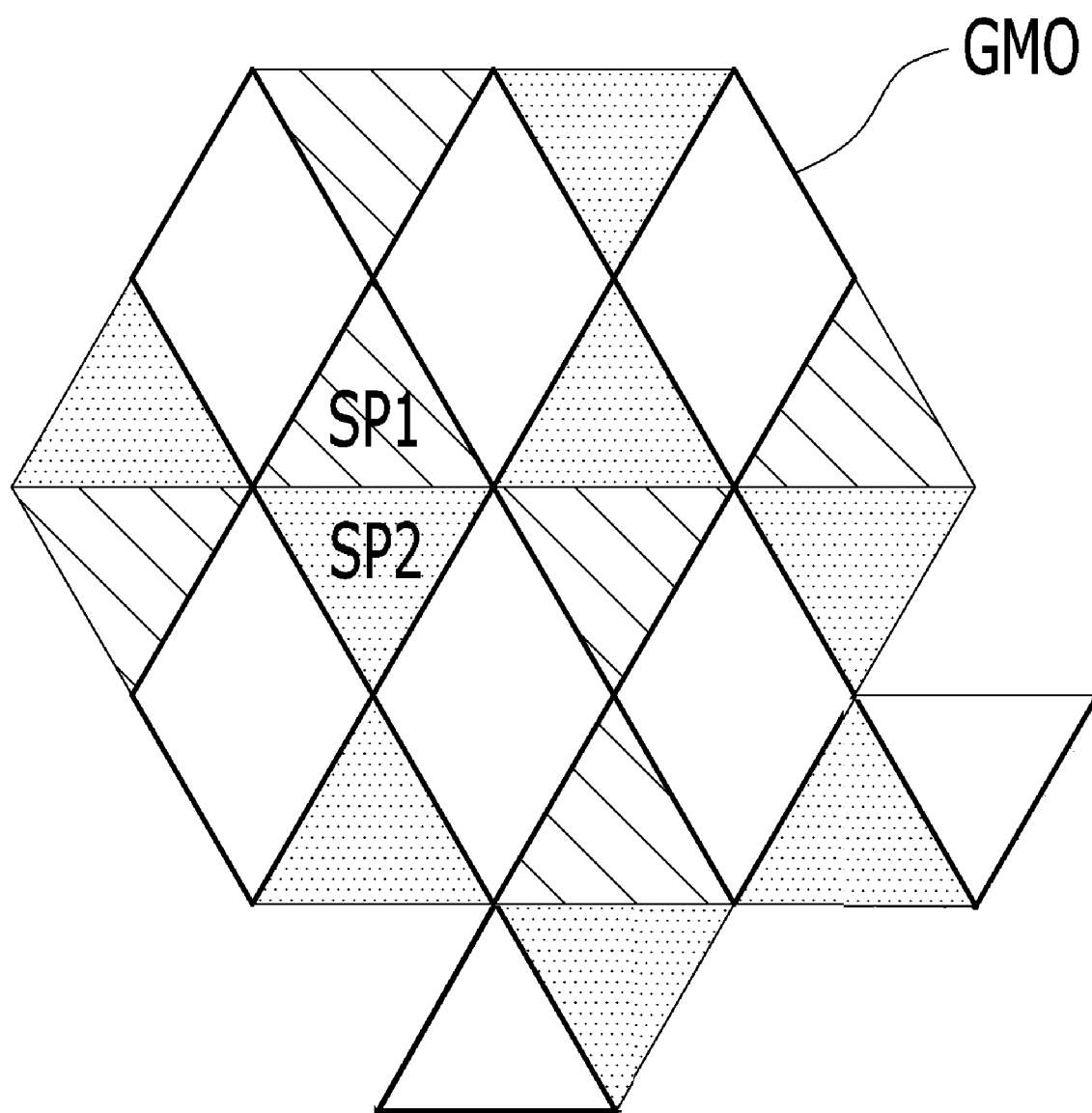

FIG. 10 is a plan view illustrating subpixel arrangement of a display device according to a third aspect of the present disclosure. FIGS. 11A to 11C are plan views illustrating masks for formation of first to third light emitting layers of FIG. 10, respectively.

As illustrated in FIG. 10, the display device according to the third aspect includes first to third subpixels SP1, SP2 and SP3 respectively including a single red light emitting layer, a single green light emitting layer and a single blue light emitting layer, and seventh subpixels SP7 each having a triple-layer structure including red, green and blue light emitting layers, to render white.

The first to third subpixels SP1 to SP3 are arranged at six divisional portions of each hexagonal area around the center of each hexagonal area, respectively, while having respective single light emitting layers, to emit red, green and blue. In this case, two sets of first to third subpixels SP1 to SP3 occupy each hexagonal area. One seventh subpixel SP7 to render white is disposed adjacent to each set of first to third subpixels SP1 to SP3 such that the seventh subpixel SP7 and the subpixel set are paired with each other.

In this case, as illustrated in FIG. 11A, openings BMO of a fine metal mask for formation of blue light emitting layers have a parallelogram shape having a shorter axis extending diagonally in right upward and left downward directions. The parallelogram openings BMO are aligned in the right upward and left downward directions. Each parallelogram opening BMO has a shape corresponding to two adjacent subpixels SP each having a triangular shape. In detail, each parallelogram opening BMO corresponds to one first subpixel SP1 and one seventh subpixel SP7 disposed adjacent to the first subpixel SP1.

As illustrated in FIG. 11B, openings RMO of a fine metal mask for formation of red light emitting layers have a parallelogram shape having a shorter axis extending diagonally in left upward and right downward directions. The parallelogram openings RMO are aligned in the left upward and right downward directions. Each parallelogram opening RMO has a shape corresponding to two adjacent subpixels SP each having a triangular shape. In detail, each parallelogram opening RMO corresponds to one second subpixel SP2 and one seventh subpixel SP7 disposed adjacent to the second subpixel SP2.

As illustrated in FIG. 11C, openings GMO of a fine metal mask for formation of green light emitting layers are arranged in a row direction while having a parallelogram shape having a longer axis extending vertically. Each parallelogram opening GMO has a shape corresponding to two adjacent subpixels SP each having a triangular shape. In detail, each parallelogram opening GMO corresponds to one third subpixel SP3 and one seventh subpixel SP7 disposed adjacent to the third subpixel SP3.

Here, the number of the seventh subpixels SP7 corresponds to the sum of the numbers of the first to third subpixels SP1 to SP3. As described above, each seventh subpixel SP7 may be arranged to be paired with each set of the first to third subpixels SP1 to SP3.

Figure 12:
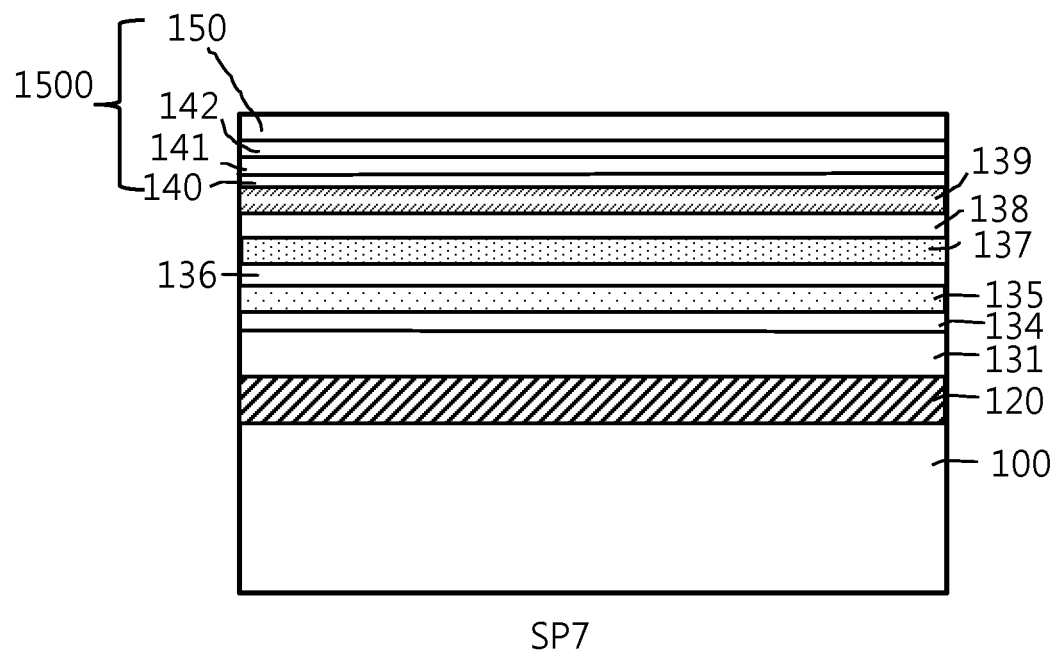
FIG. 12 is a cross-sectional view illustrating one seventh subpixel in the third aspect of the present disclosure.

FIG. 12 is a cross-sectional view illustrating one seventh subpixel in the third aspect of the present disclosure.

The first to third subpixels in the third aspect of the present disclosure have structures of the first to third subpixels of FIG. 3 to emit blue, red and green, respectively. Each of the first to third subpixels is provided with a single light emitting layer.

As illustrated in FIG. 12, the seventh subpixel includes a first light emitting layer 135 to emit blue, a second light emitting layer 137 to emit red, and a third light emitting layer 139 to emit green, which overlap with one another. First and second charge generation layers 136 and 138 are disposed between adjacent ones of the light emitting layers, respectively. Each of the first and second charge generation layers 136 and 138 may have a laminated structure of an n-type charge generation layer and a p-type charge generation layer. The n-type charge generation layer functions to supply electrons to a lower one of the light emitting layers, and the p-type charge generation layer functions to supply holes to an upper one of the light emitting layers.

The laminated structure of the light emitting layers 135, 137 and 139, the structures of the first and second charge generation layers 136 and 138, provision of a hole transport layer 131 and an electron blocking layer as common layers having a hole transport property, provision of a hole blocking layer 140 and an electron transport layer 141 having an electron transport property on the third light emitting layer 139 disposed at an uppermost position, and subsequent formation of a second electrode 142 and a capping layer 150 are identical to those of the first to third subpixels SP1, SP2 and SP3 as described above, and, as such, no description will be given of the same configurations. In this case, the seventh subpixel has a triple-layer structure of different light emitting layers, that is, red, green and blue light emitting layers, and, as such, emission of white is finally achieved.

Figure 13:
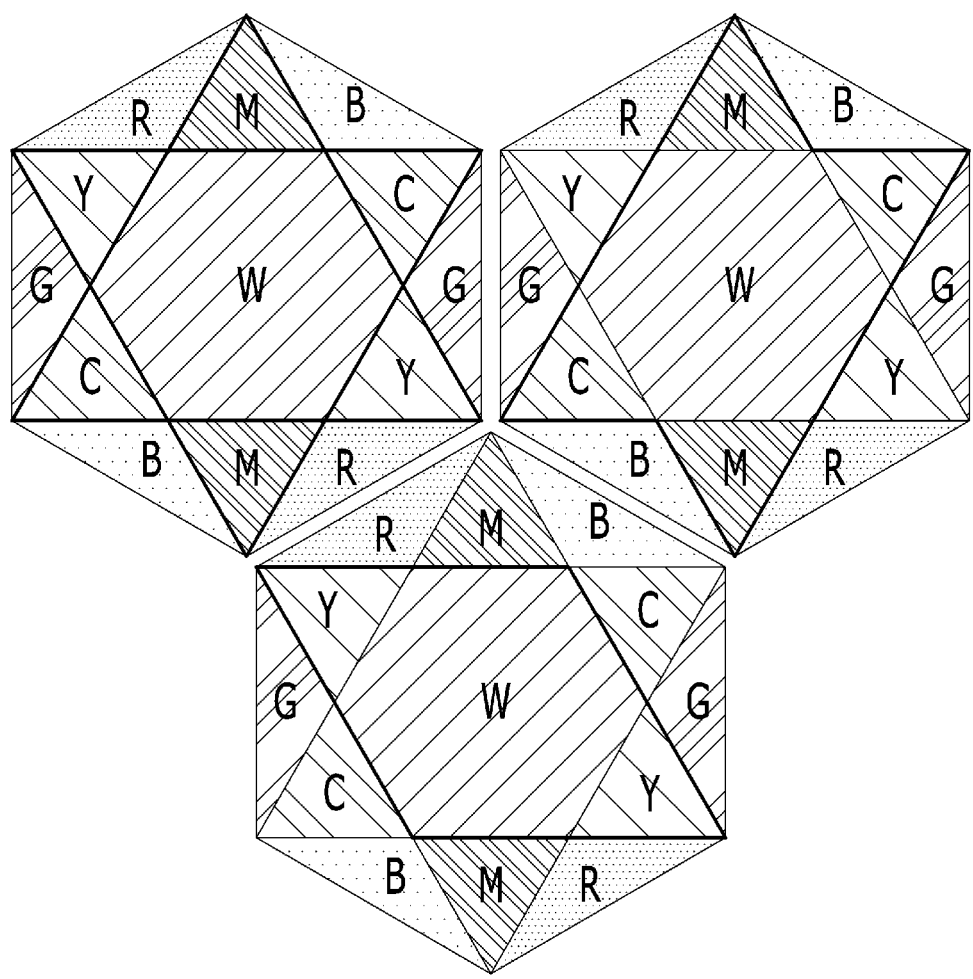
FIG. 13 is a plan view illustrating subpixel arrangement of a display device according to a fourth aspect of the present disclosure.
Figure 14A:
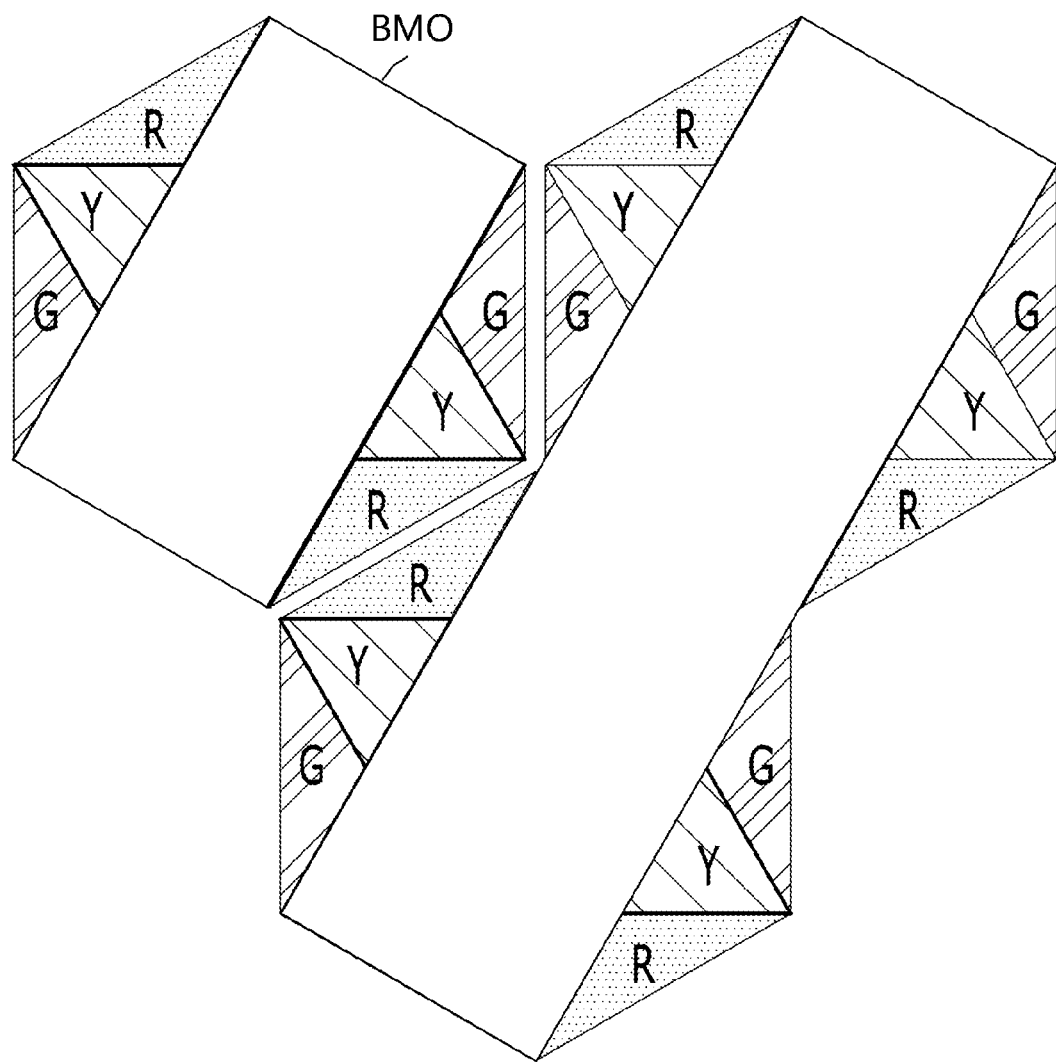
FIGS. 14A to 14C are plan views illustrating masks for formation of first to third light emitting layers of FIG. 13, respectively.
Figure 14B:
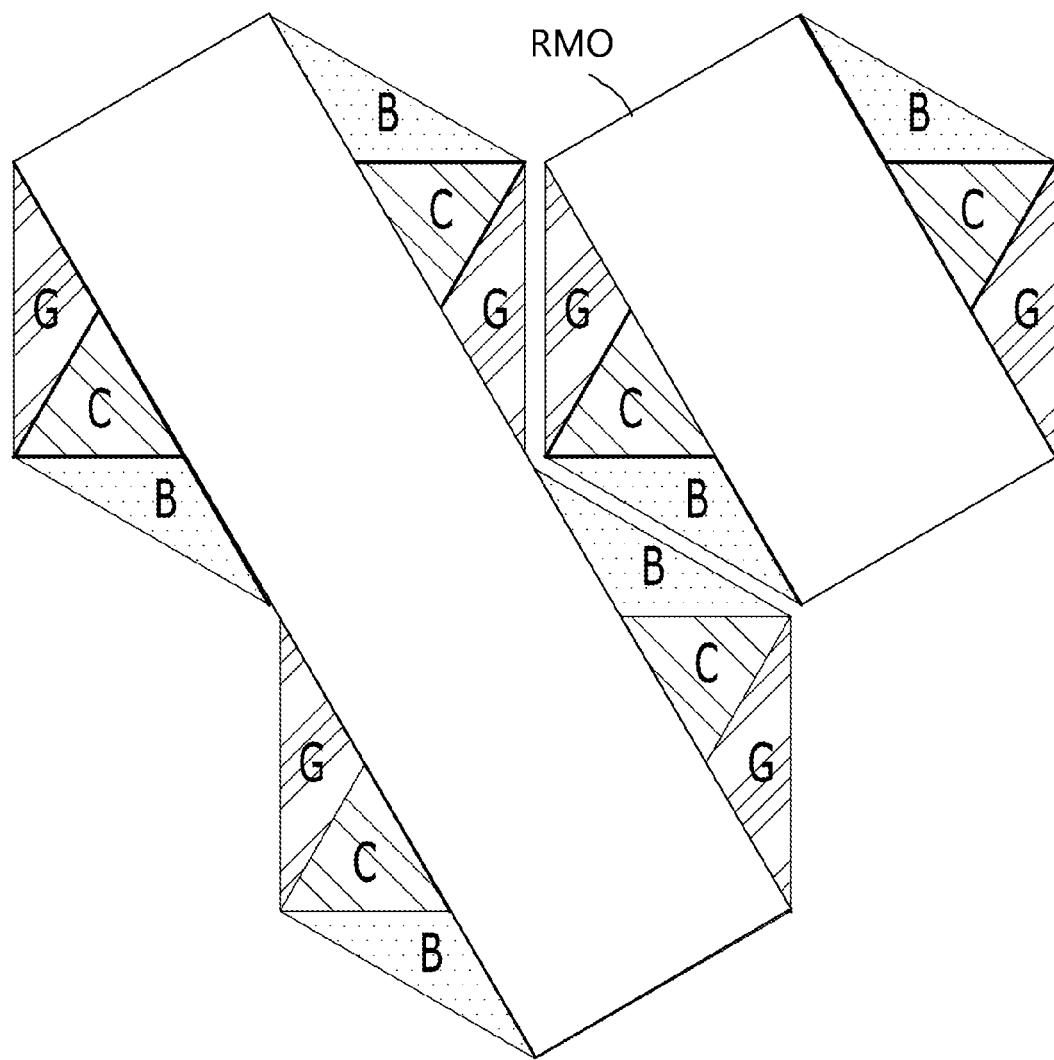
Figure 14C:
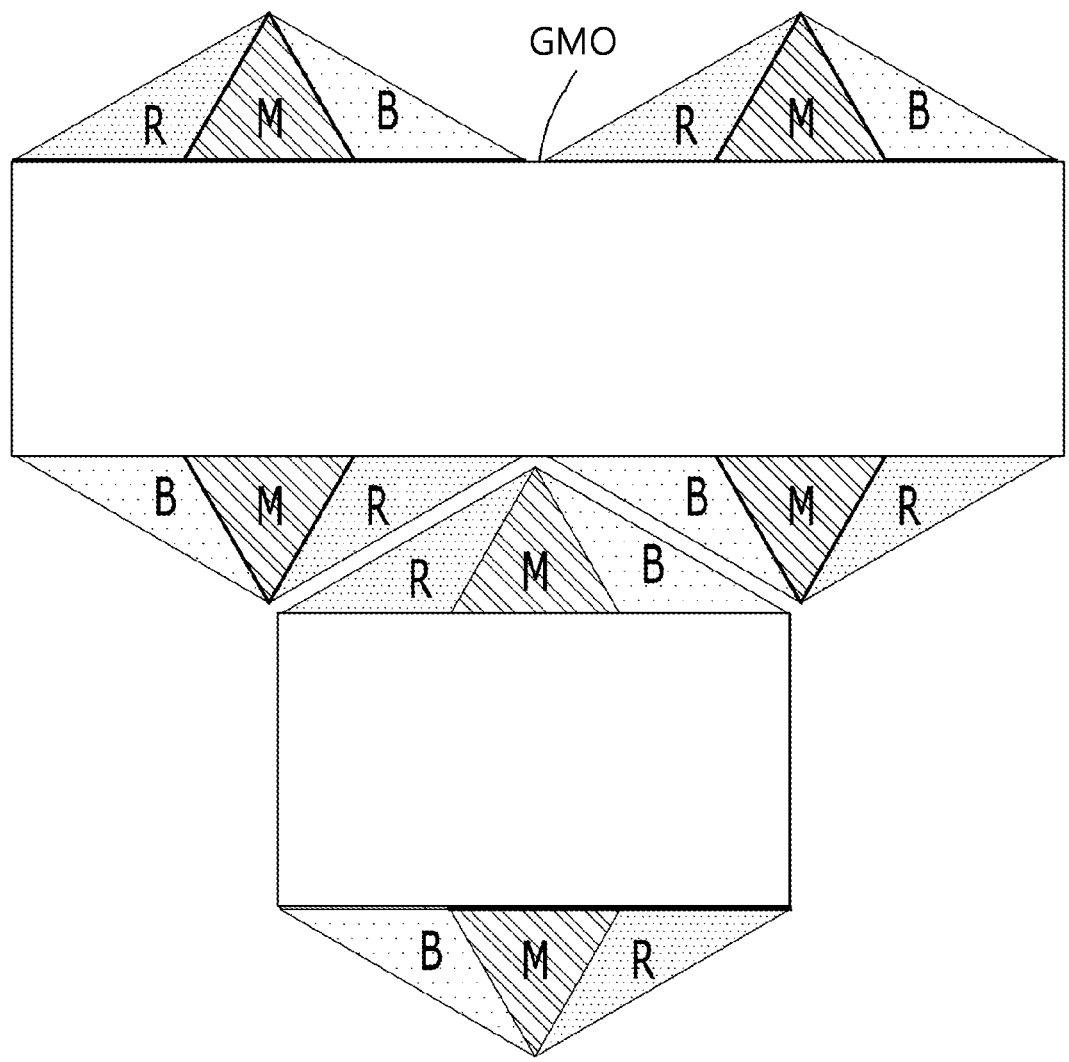

FIG. 13 is a plan view illustrating subpixel arrangement of a display device according to a fourth aspect of the present disclosure. FIGS. 14A to 14C are plan views illustrating masks for formation of first to third light emitting layers of FIG. 13, respectively.

As illustrated in FIG. 13, the display device according to the fourth aspect includes first to third subpixels SP1, SP2 and SP3 respectively including a single blue (B) light emitting layer, a single red (R) light emitting layer and a single green (G) light emitting layer, fourth to sixth subpixels SP4, SP5 and SP6 each having a double-layer structure including two overlapping light emitting layers, to emit an associated one of magenta (M), yellow (Y) and cyan (C), and seventh subpixels SP7 each having a triple-layer structure including red, green and blue light emitting layers, to render white. Referring to planar arrangements of the subpixels in the display device, each seventh subpixel SP7 to render white is disposed in a smaller hexagonal area disposed at a central portion of a greater hexagonal area. Two sets of fourth to sixth subpixels SP4, SP5 and SP6 each having a double-layer structure of light emitting layers are disposed around the smaller hexagonal area in the form of a star having the smaller hexagonal area as a core. Two sets of first to third subpixels SP1 to SP3 are disposed around the two sets of fourth to sixth subpixels SP4, SP5 and SP6 in such a manner that the second, third and first subpixels SP2, SP3 and SP1 to emit red, green and blue are disposed between adjacent ones of the fourth to sixth subpixels SP4, SP5 and SP6, respectively.

The planar arrangement of FIG. 13 has the greatest white emission area and, as such, may be useful in a display device in which effects of high brightness is important. In the structure of the fourth aspect, it may be possible to simultaneously achieve rendering of red, green and blue and rendering of secondary colors of the primary colors, that is, magenta, yellow and cyan. In particular, when subpixel sets each including first to seventh subpixels to emit different colors are configured as hexagonal unit cells, respectively, the seventh subpixel SP7 to emit white in each subpixel set occupies ⅓ or more of the area of the unit cell and, as such, effects of high brightness may be easily achieved.

Meanwhile, arrangement of the first to seventh subpixels in FIG. 13 is only illustrative. Subpixel arrangement may be varied in accordance with rendering of required colors.

In addition, the first to third subpixels each having a light emitting layer for emission of a single color (subpixels for emission of B, R and G) and the fourth to sixth subpixels each having a light emitting layer for emission of a secondary color (subpixels for emission of M, Y and C) have the same cross-sectional structures as those of FIG. 3. The seventh subpixels to render white through provision of a triple-layer structure of light emitting layers have a laminated structure of FIG. 12.

In the display device according to the fourth aspect of the present disclosure, as illustrated in FIG. 14A, openings BMO of a fine metal mask for formation of first light emitting layers to emit blue extend diagonally lengthily in right upward and left downward directions. As illustrated in FIG. 14B, openings RMO of a fine metal mask for formation of second light emitting layers to emit red extend diagonally lengthily in left upward and right downward directions. As illustrated in FIG. 14C, openings GMO of a fine metal mask for formation of third light emitting layers to emit green extend horizontally lengthily. The openings of each fine metal mask have a greater area than non-open portions of the fine metal mask and, as such, the display device has double-layer overlap areas each having two light emitting layers overlapping each other, and triple-layer overlap areas each having three light emitting layers overlapping with one another. In addition, the openings of each fine metal mask are configured such that the triple-area overlay areas occupy ⅓ or more of the entire active area. Accordingly, it may be possible to secure a white emission area having a predetermined area or greater and, as such, effects of high brightness may be achieved.

The display device of the present disclosure includes subpixels each including a single light emitting layer, and subpixels each disposed adjacent to associated ones of the former subpixels while including extensions of the light emitting layers of the associated subpixels as overlapping light emitting layers thereof. Accordingly, the display device of the present disclosure may achieve rendering of various colors.

In addition, in connection with rendering of plural colors, it may be possible to render secondary colors through overlap of light emitting layers without additional material development or application. That is, it may be possible to realize sufficiently high resolution for virtual reality (VR) or augmented reality (AR).

Furthermore, since rendering of secondary colors is possible, it may be possible to achieve effects of high resolution under the same conditions as those of formation of 3-color light emitting layers, without reducing openings of fine metal masks or without using an additional fine metal mask. In addition, limitation of fine metal masks may be overcome. In particular, there is no restriction as to use of equipment in embodying subpixels each including a single light emitting layer and subpixels each including a plurality of overlapping light emitting layers.

Meanwhile, in the display device of the present disclosure, rendering of a secondary color may be achieved through driving of a single subpixel and, as such, it may be possible to reduce power consumption, as compared to a structure including general R, G and B subpixels arranged such that rendering of a secondary color is achieved through simultaneous driving of adjacent ones of the subpixels.

The display device of the present disclosure and the manufacturing method thereof as described above may have the following effects.

First, the display device of the present disclosure may achieve rendering of various colors because the display device of the present disclosure includes subpixels each including a single light emitting layer, and subpixels each disposed adjacent to associated ones of the former subpixels while including extensions of the light emitting layers of the associated subpixels as overlapping light emitting layers thereof.

Second, in connection with rendering of plural colors, it may be possible to render secondary colors through overlap of light emitting layers without additional material development or application. That is, it may be possible to realize sufficiently high resolution for virtual reality (VR) or augmented reality (AR).

Third, since rendering of secondary colors is possible, it may be possible to achieve effects of high resolution under the same conditions as those of formation of 3-color light emitting layers, without reducing openings of fine metal masks or without using an additional fine metal mask. In addition, limitation of fine metal masks may be overcome. In particular, there is no restriction as to use of equipment in embodying subpixels each including a single light emitting layer and subpixels each including a plurality of overlapping light emitting layers.

Fourth, in the display device of the present disclosure, rendering of a secondary color may be achieved through driving of a single subpixel and, as such, it may be possible to reduce power consumption, as compared to a structure including general R, G and B subpixels arranged such that rendering of a secondary color is achieved through simultaneous driving of adjacent ones of the subpixels.

It will be apparent to those skilled in the art that various modifications and variations can be made in the present disclosure without departing from the spirit or scope of the disclosure. Thus, it is intended that the present disclosure cover the modifications and variations of this disclosure provided they come within the scope of the appended claims and their equivalents.

What is claimed is:

1. A method for manufacturing a display device, comprising:
    forming first electrodes at a plurality of subpixels on a substrate;
    forming a first light emitting layer, a second emitting layer and a third emitting layer emitting different single colors in predetermined areas at a part of the subpixels as single-type light emitting layers, thereby providing reference subpixels, and forming at least two of the first to third light emitting layers at a remaining part of the subpixels such that the light emitting layers overlap each other to form mixed subpixels;
    forming a charge generation layer between the at least two light emitting layers of each of the mixed subpixels; and
    forming a second electrode on the first to third light emitting layers over the reference subpixels and the mixed subpixels.

2. The method according to claim 1, wherein each of the first to third light emitting layers is formed in at least two of the subpixels upon at least one of the reference subpixels and at least one of the mixed subpixels.

3. The method according to claim 1, further comprising forming a bank at boundaries of the reference subpixels and the mixed subpixels after the formation of the first electrodes.

4. The method according to claim 3, wherein each of the first to third light emitting layers extends over an associated one of the reference subpixels and the bank disposed adjacent to two or more of the mixed subpixels adjacent to the associated reference subpixel.

5. The method according to claim 3,
    wherein the reference subpixels includes a first subpixel, a second subpixel and a third subpixel, and the first emitting layer, the second emitting layer and third emitting layer are provided at the first subpixel, the second subpixel and the third subpixel, respectively,
    wherein the mixed subpixels include a fourth subpixel between the first and second subpixel, a fifth subpixel between the second and third subpixels, and a sixth subpixel between the first and third subpixels.

6. The method according to claim 5,
    wherein the first light emitting layer is extended to the fourth and sixth subpixels, and continuous over the first, the fourth and sixth subpixels and the bank therebetween,
    wherein the second light emitting layer is extended to the fourth and fifth subpixels, and continuous over the second, the fourth and fifth subpixels and the bank therebetween, and
    wherein the third light emitting layer is extended to the fifth and sixth subpixels and continuous over the third, fifth and sixth subpixels and the bank therebetween.

7. The method according to claim 2, wherein the first light emitting layer has a peak wavelength in a wavelength range of 430 to 480 nm,
    wherein the second light emitting layer has a peak wavelength in a wavelength range of 600 to 650 nm, and
    wherein the third light emitting layer has a peak wavelength in a wavelength range a 500 to 580 nm.

8. The method according to claim 1, further comprising:
    forming a common hole transport layer over the first to sixth subpixels between the first electrode and the first light emitting layer; and
    forming a common electron transport layer over the first to sixth subpixels between third light emitting layer and the second electrode.

9. The method according to claim 8, wherein the common hole transport layer extends continuously through the first to sixth subpixels, and
    wherein the common electron transport layer extends continuously through the first to sixth subpixels.

10. The method according to claim 5, wherein the first to sixth subpixels are respectively arranged within 6 divisional portions of a hexagonal area in an order of the first subpixel, the fourth subpixel, the second subpixel, the fifth subpixel, the third subpixel and the sixth subpixel.

11. The method according to claim 5, wherein each of the first light emitting layer, the second emitting layer and the third emitting layer is formed by a mask to have an opening corresponding to continuous three subpixels arranged in one of a row direction, a column direction and a diagonal direction.

12. The method according to claim 1, wherein at least one of the first light emitting layer, the second emitting layer and the third emitting layer is formed by a mask to have a plurality of openings, each opening corresponding to one reference subpixel and at least two mixed subpixel.

13. The method according to claim 12, wherein the each opening of the mask has one of a rectangular shape, a parallelogram and a triangular shape.

14. A method for manufacturing a display device, comprising:
    forming a first electrode at each of a first subpixel, a second subpixel and a mixed subpixel on a substrate, the mixed subpixel provided at at least between the first and second subpixels;
    forming a first light emitting layer emitting a first single color at the first subpixel and the mixed subpixel,
    forming a charge generation layer at the mixed subpixel;
    forming a second light emitting layer emitting a second single color different from the first single color at the second subpixel and the mixed subpixel; and
    forming a second electrode over the first subpixel, and the second subpixel and the mixed subpixel,
    wherein the charge generation layer is between the first light emitting layer and the second light emitting layer at the mixed subpixel, and
    wherein the charge generation layer does not overlap with the first and second subpixels.

15. The method according to claim 14, further comprising:
    forming a common hole transport layer over the first subpixel, and the second subpixel and the mixed subpixel the first to sixth subpixels between the first electrode and the first light emitting layer; and
    forming a common electron transport layer over the first subpixel, and the second subpixel and the mixed subpixel between third light emitting layer and the second electrode.

16. A method for manufacturing a display device, comprising:
    forming a reference subpixel comprising a first subpixel, a second subpixel and a third subpixel on a substrate;
    forming a mixed subpixel comprising a fourth subpixel, a fifth subpixel and a sixth subpixel on the substrate;
    forming a first electrode at each of the first to sixth subpixels;
    a first light emitting layer at the first subpixel, the fourth subpixel and the sixth subpixel;

forming a first charge generation layer on the first light emitting layer at the fourth subpixel and the sixth subpixel;

forming a second light emitting layer at the second subpixel, the fourth subpixel and the fifth subpixel;

forming a second charge generation layer on the second light emitting layer at the fifth subpixel;

forming a third light emitting at the third subpixel at the third subpixel, the fifth subpixel and the sixth subpixel; and forming a second electrode on the first to third light emitting layers over the first to sixth subpixels, wherein the first to third light emitting layers emit different single colors.

17. The method according to claim 16, wherein the first to sixth subpixels are arranged in a row direction, in a column direction in an order of the first subpixel, the fourth subpixel, the second subpixel, the fifth subpixel, the third subpixel and the sixth subpixel.

18. The method according to claim 16, wherein the first to sixth subpixels are respectively arranged within 6 divisional portions of a hexagonal area in an order of the first subpixel, the fourth subpixel, the second subpixel, the fifth subpixel, the third subpixel and the sixth subpixel.

19. The method according to claim 16, wherein in the step of forming the mixed subpixel, further comprising: forming a seventh subpixel including the first light emitting layer, the first charge generation layer, the second light emitting layer, the second charge generation layer and the third light emitting layer laminated in this order.

20. The method according to claim 19, wherein the first to sixth subpixels are disposed around the seventh subpixel in an order of the first subpixel, the fourth subpixel, the second subpixel, the fifth subpixel, the third subpixel and the sixth subpixel.

* * * * *